US006550028B1

(12) United States Patent
Akaogi et al.

(10) Patent No.: US 6,550,028 B1
(45) Date of Patent: Apr. 15, 2003

(54) ARRAY VT MODE IMPLEMENTATION FOR A SIMULTANEOUS OPERATION FLASH MEMORY DEVICE

(75) Inventors: Takao Akaogi, Cupertino, CA (US); Tiao-Hua Kuo, San Jose, CA (US); Fan W. Lai, Sunnyvale, CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/421,470

(22) Filed: Oct. 19, 1999

(51) Int. Cl.[7] .............................. G11C 29/00; G11C 7/00

(52) U.S. Cl. ...................... 714/721; 714/719; 365/201

(58) Field of Search ................................ 714/719, 721; 365/200, 201

(56) References Cited

U.S. PATENT DOCUMENTS

| | | | | |
|---|---|---|---|---|
| 5,142,496 A | * | 8/1992 | Van Buskirk | 365/201 |
| 5,153,853 A | * | 10/1992 | Eby et al. | 365/185.08 |
| 5,233,562 A | * | 8/1993 | Ong et al. | 365/185.22 |
| 5,263,000 A | | 11/1993 | Buskirk et al. | 365/226 |
| 5,291,446 A | | 3/1994 | Buskirk et al. | 365/189.09 |
| 5,357,462 A | * | 10/1994 | Tanaka et al. | 365/185.13 |
| 5,386,422 A | * | 1/1995 | Endoh et al. | 365/185.11 |
| 5,469,444 A | * | 11/1995 | Endoh et al. | 365/185.12 |
| 5,481,494 A | * | 1/1996 | Tang et al. | 365/185.24 |
| 5,708,387 A | | 1/1998 | Cleveland et al. | 327/536 |
| 5,748,546 A | * | 5/1998 | Bauer et al. | 365/210 |
| 5,790,459 A | * | 8/1998 | Roohparvar | 365/185.18 |
| 5,841,696 A | | 11/1998 | Chen et al. | 365/185.11 |
| 5,847,998 A | | 12/1998 | Buskirk | 365/185.33 |
| 5,867,430 A | | 2/1999 | Chen et al. | 365/189.04 |
| 5,909,398 A | * | 6/1999 | Tanzawa et al. | 365/185.29 |
| 5,930,188 A | * | 7/1999 | Roohparvar | 365/185.18 |
| 5,959,929 A | * | 9/1999 | Cowles et al. | 365/230.03 |
| 5,963,500 A | * | 10/1999 | Taura et al. | 365/189.02 |
| 5,986,944 A | * | 11/1999 | Merritt | 365/189.05 |
| 5,996,106 A | * | 11/1999 | Seyyedy | 714/763 |
| 6,005,803 A | | 12/1999 | Kuo et al. | 365/185.11 |
| 6,011,721 A | * | 1/2000 | Sunkavalli | 365/185.22 |
| 6,016,270 A | | 1/2000 | Thummalapally et al. | 365/185.11 |
| 6,026,465 A | * | 2/2000 | Mills et al. | 711/103 |
| 6,049,502 A | * | 4/2000 | Cowles et al. | 365/230.03 |
| 6,052,310 A | * | 4/2000 | Sunkavalli | 365/185.29 |
| 6,128,219 A | * | 10/2000 | Pio et al. | 365/185.05 |
| 6,172,909 B1 | * | 1/2001 | Haddad et al. | 365/185.19 |
| 6,324,108 B1 | * | 11/2001 | Bill et al. | 365/201 |
| 6,381,670 B1 | * | 4/2002 | Lee et al. | 711/103 |
| 6,418,070 B1 | * | 7/2002 | Harrington et al. | 365/201 |

OTHER PUBLICATIONS

US 5,612,921, 3/1997, Chang et al. (withdrawn)
Calligaro, C.; Gastaldi, R.; Manstretta, A. and Torelli, G.; A high–speed parallel sensing scheme for multi–level non–volatile memories; 1997 International Workshop on Memory Technology, Design and Testing Proceedings, pp.: 96–101.*
Khubchandani, R.; A fast test to generate flash memory threshold voltage distribution map; Records of the 1999 IEEE International Workshop on Memory Technology, Design and Testing; pp.: 78–82; Aug. 9–10, 1999.*

(List continued on next page.)

*Primary Examiner*—Albert Decady
*Assistant Examiner*—Joseph D. Torres

(57) ABSTRACT

An array threshold voltage test mode for a flash memory device is disclosed. During the test mode, a test voltage is routed directly to the gates of the flash memory transistors selected by a given address. If the test voltage causes the selected transistors to change state by crossing their threshold voltage level, the change will be reflected in the data outputs of the device. By varying the test voltages and the addresses and monitoring the data outputs, the array threshold voltage distribution can be determined for the entire device.

30 Claims, 32 Drawing Sheets

OTHER PUBLICATIONS

Brian Dipert and Markus Levy "Designing with Flash Memory—The definitive guide to designing flash memory hardware and software for components and PCMCIA cards", Annabooks, ISBN 0–929392–17–5, Ch. 3, pp. 23–44.

AMD, Technology Background brochure, "3.0 Volt–only Page Mode Flash Memory Technology".

AMD, Technology Background brochure, "3.0 Volt–only Burst Mode Flash Memory Technology".

AMD, Technology Background brochure, "1.8 Volt–only Flash Memory Technology".

AMD, Technology Background brochure, "AMD DL160 and DL320 Series Flash: New Densities, New Features".

Intel Corporation, "Common Flash Memory Interface Specification", Release 1.1, May 30, 1997.

AMD, "Common Flash Memory Interface Publication 100—Vendor & Device ID Code Assignments", Jul. 25, 1996, vol. 96.1.

AMD "Am29DL162C/AM29DL163C 16 Megabit (2 M×8–Bit/1 M×16–Bit) CMOS 3.0 Volt–only, Simultaneous Operation Flash Memory", Publication 21533, Rev: C Amendment/+2, Jul. 14, 1999.

Intel Corporation, "1.8 Volt Intel® Dual–Plane Flash Memory 28F320D18 (×16)", Product Review Datasheet, Order No.: 290672–002, Oct. 1999.

Macronix International Co., Ltd. "MXIC Advance Information MX29VW160T/B—16M–BIT [2M×8–BIT/1M×16–BIT] Simultaneous Read/Write Single 2.5V Operation Flash Memory", P/N:PM0567, Rev. 0.8, May 17, 1999.

ATMEL Coporation, "ATMEL® 16–megabit (1M×16/2M×8) 3–volt Only Flash Memory", Rev. 0925H–Aug. 1999.

STMicroelectronics, "M59DR032A, M59DR032B, 32 Mbit (2Mb×16, Dual Bank, Page) Low Voltage Flash Memory", preliminary data, Oct. 1999, pp. 1–38.

"AMD—Flash Introdution", obtained at the internet address http://www.amd.com/products/nvd/overview/flash_intro.html, Apr. 14, 1999.

"AMD—Simultaneous Read/Write", obtained at the internet address http://www.amd.com/products/nvd/overview/simuintro.html, Jul. 12, 1999.

"AMD News Release#9879", obtained at the internet address http://www.amd.com/news/prodpr/9879.html.

"Intel® 1.8 Volt Dual–Plane 32–Mbit Flash Memory (D18)", obtained at the internet address http://www.intel.com/design/flcomp/prodbref/298131.htm, Nov. 18, 1999.

U.S. patent application, Ser. No. 09/159,029, filed Sep. 23, 1998.

U.S. patent application, Ser. No. 09/159,142, filed Sep. 23, 1998.

U.S. patent application, Ser. No. 09/159,489, filed Sep. 23,1998.

* cited by examiner

Figure 3 TEST_LOGIC

Figure 4 HVD

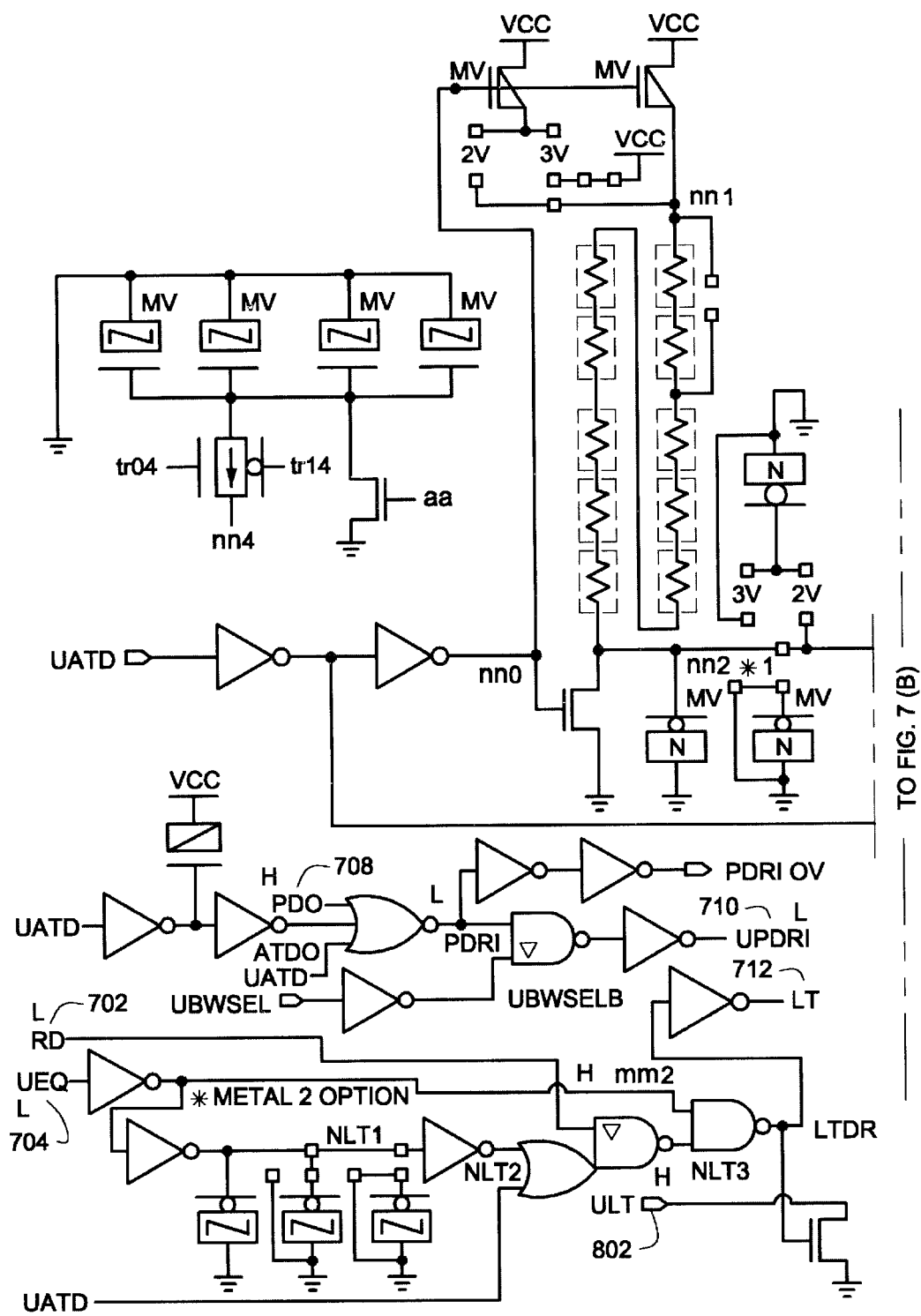
Figure 7(A) UTIME

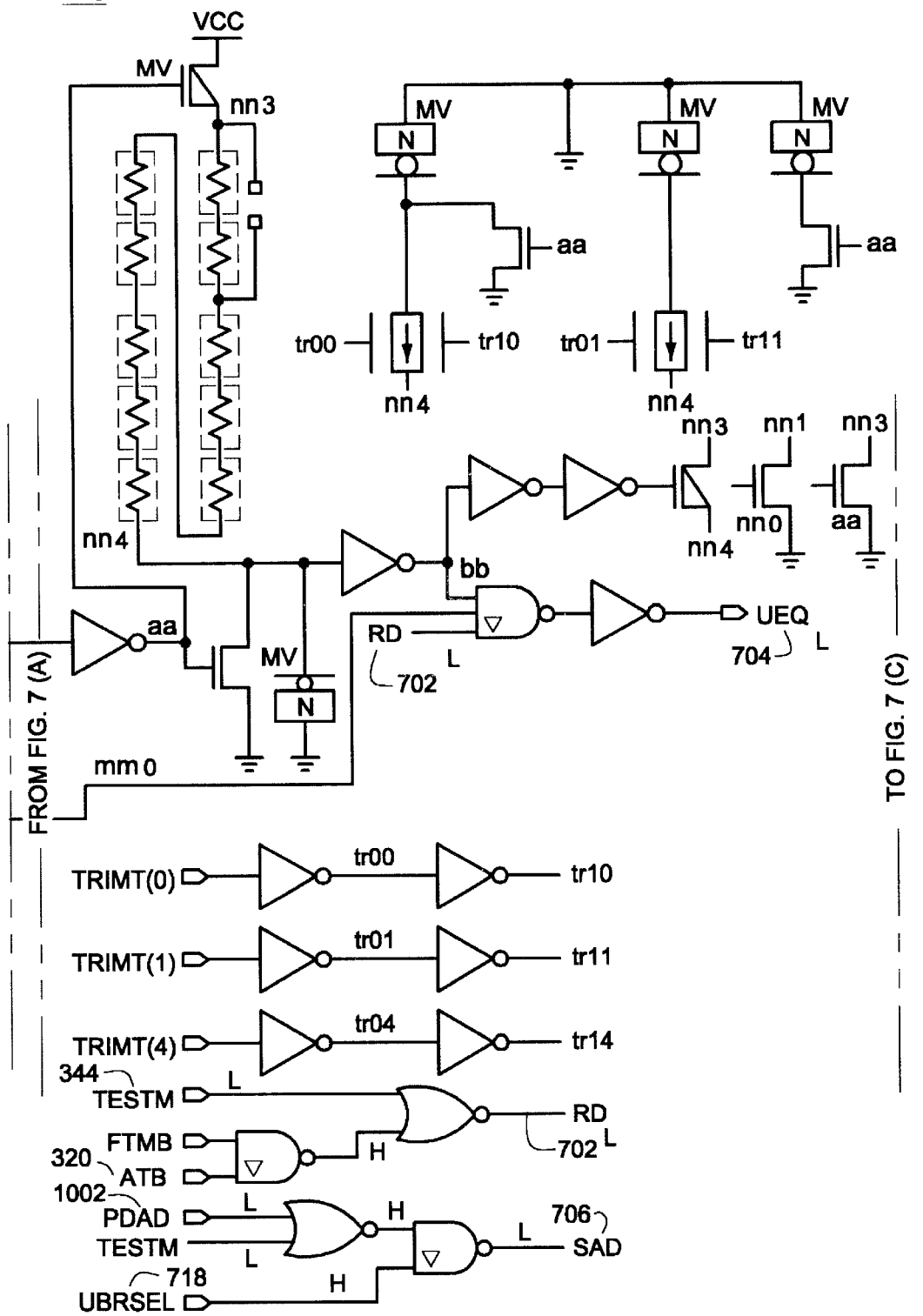
Figure 7(B) UTIME

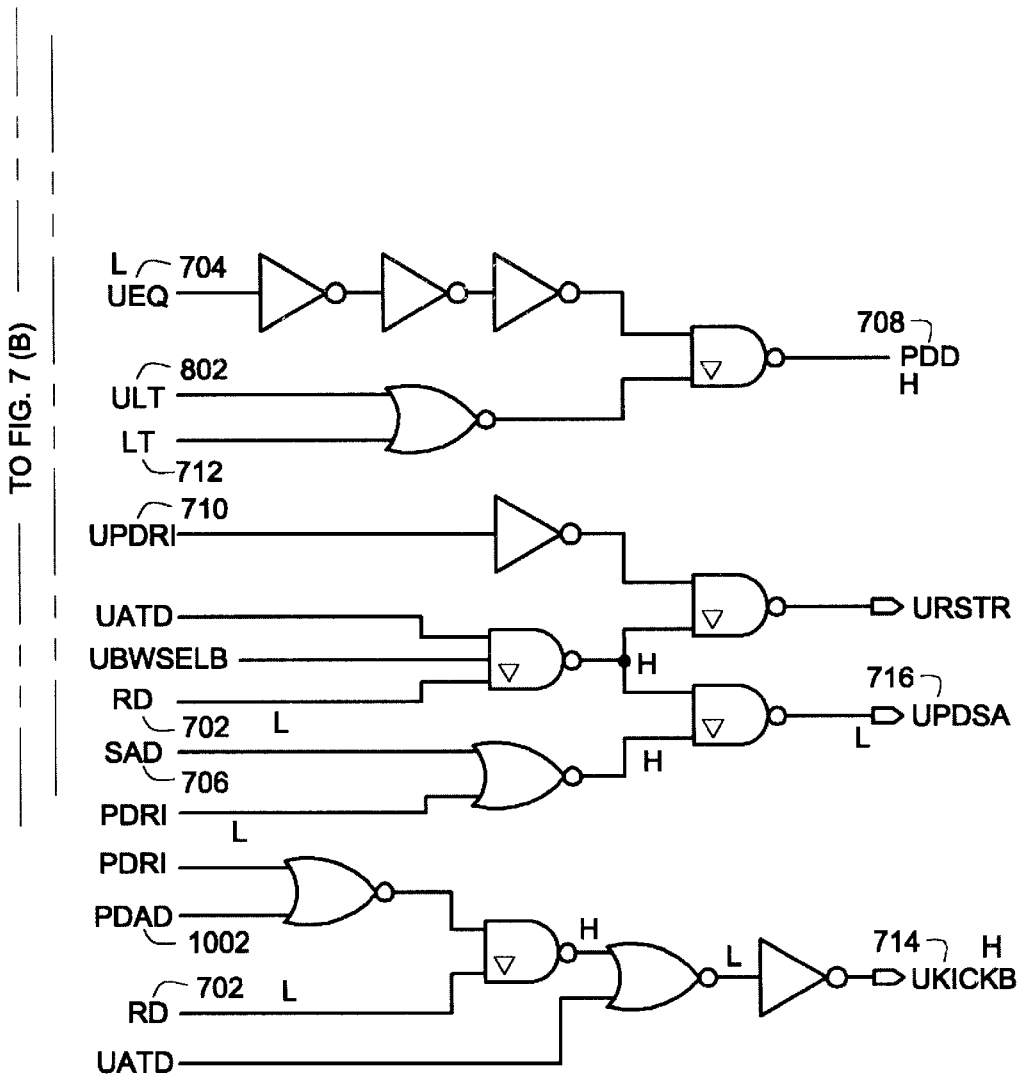
Figure 7(C) UTIME

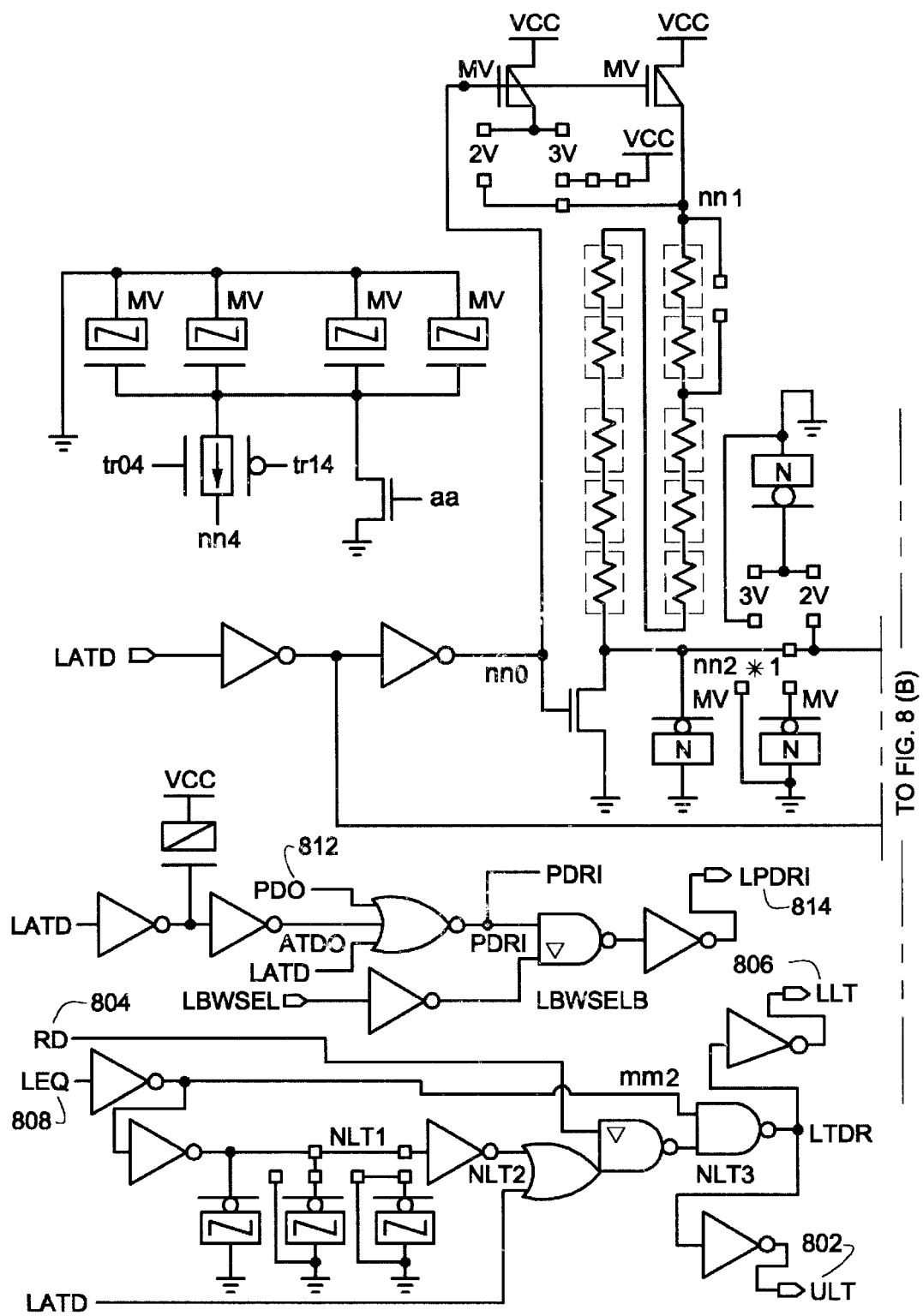
Figure 8(A) LTIME

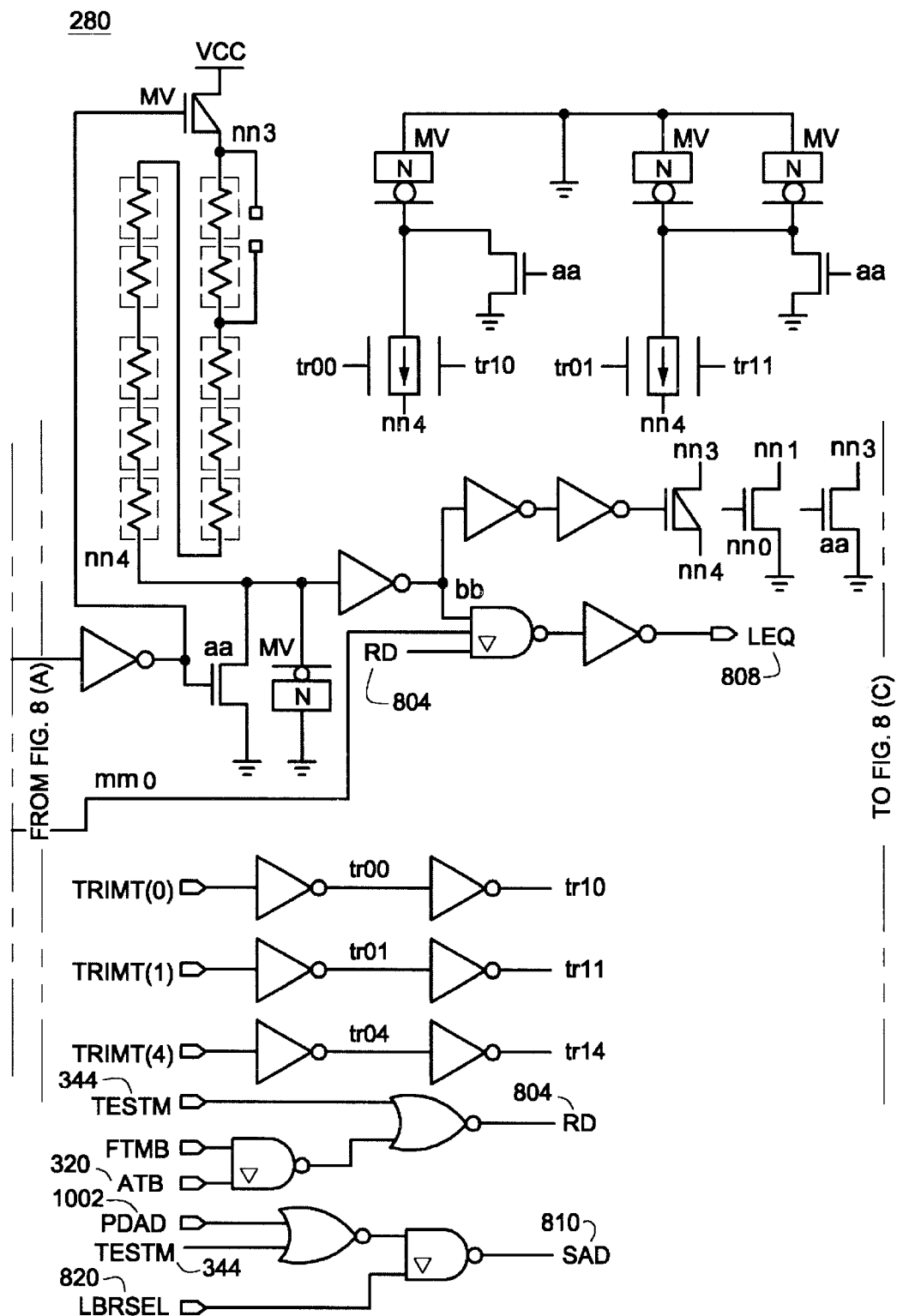
Figure 8(B) LTIME

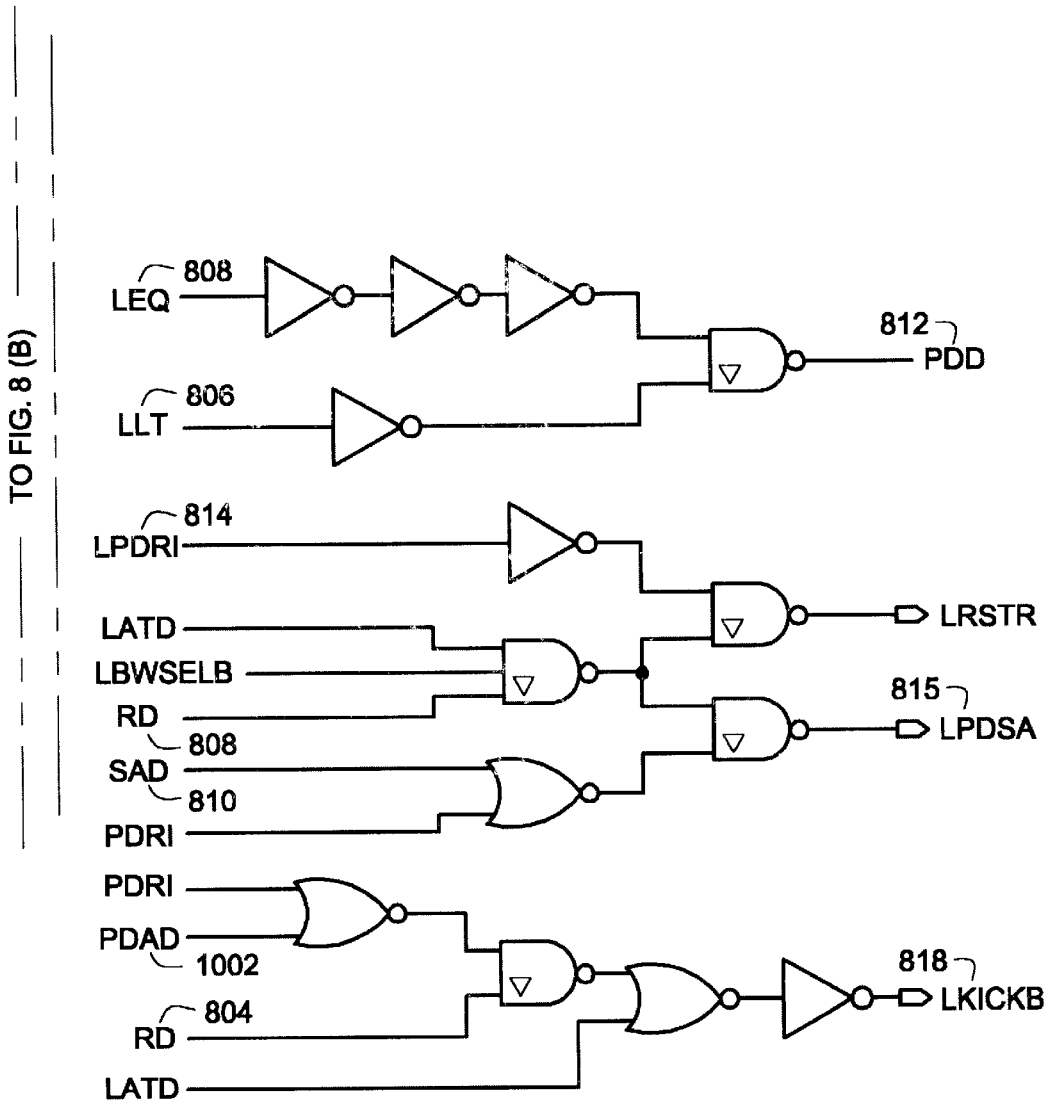
Figure 8(C) LTIME

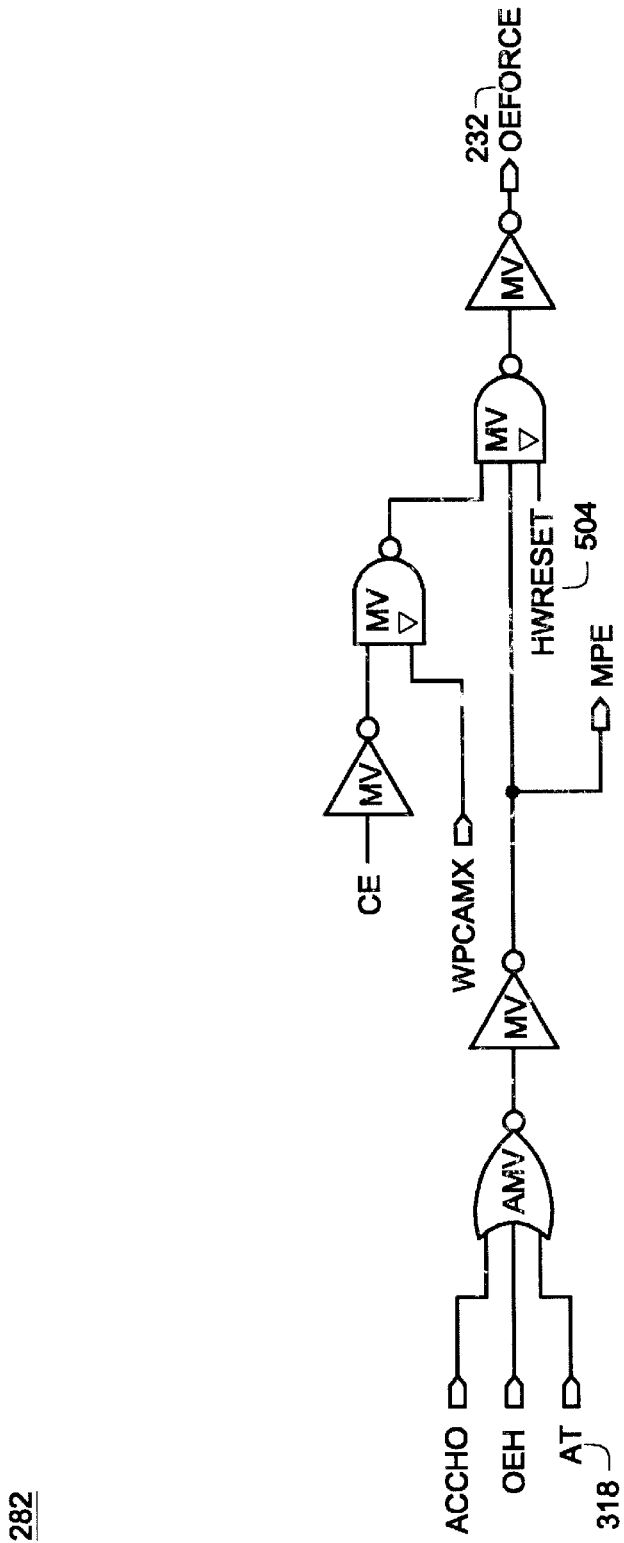
Figure 9  TEST_LOGIC_2

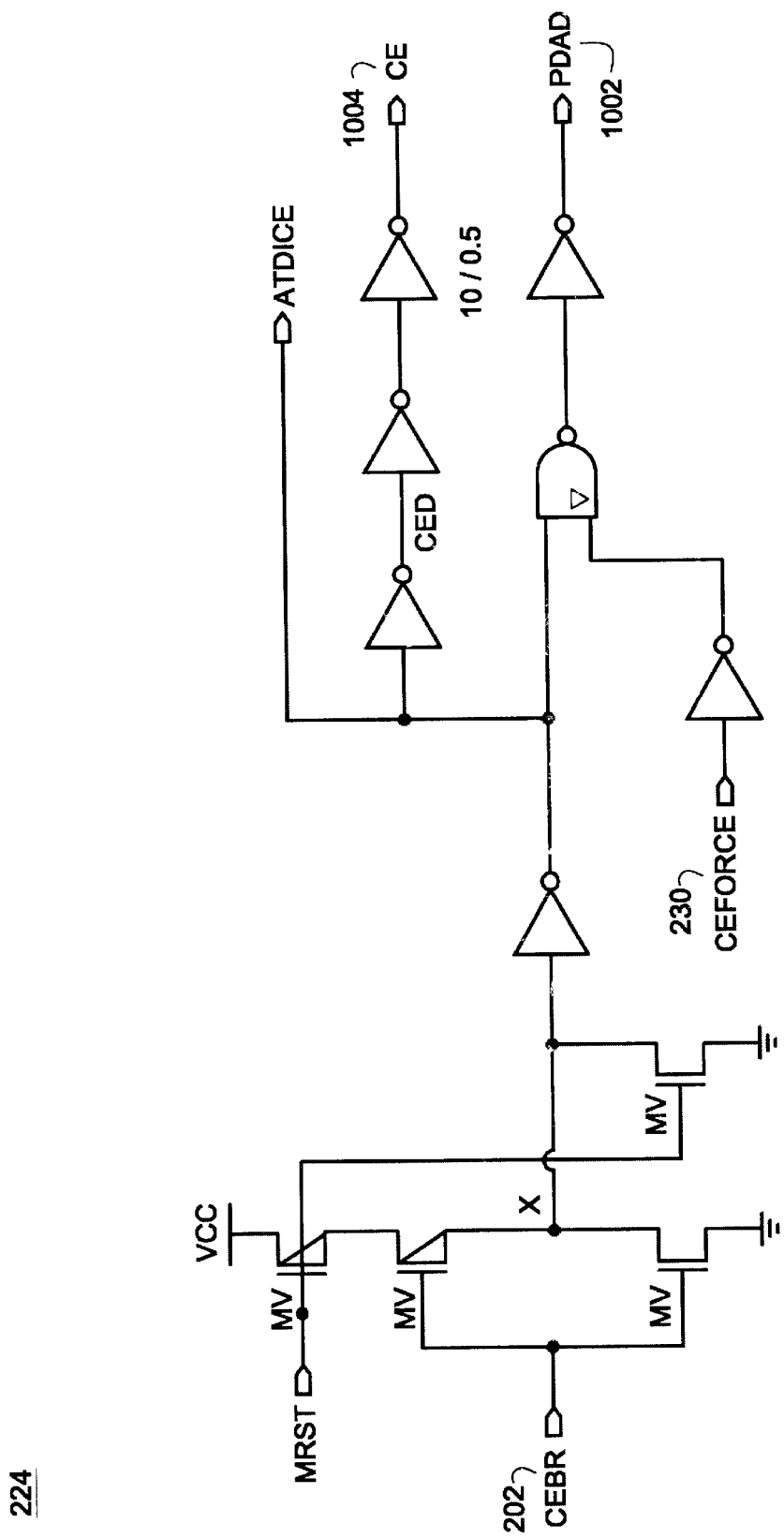
Figure 10 CEBUF

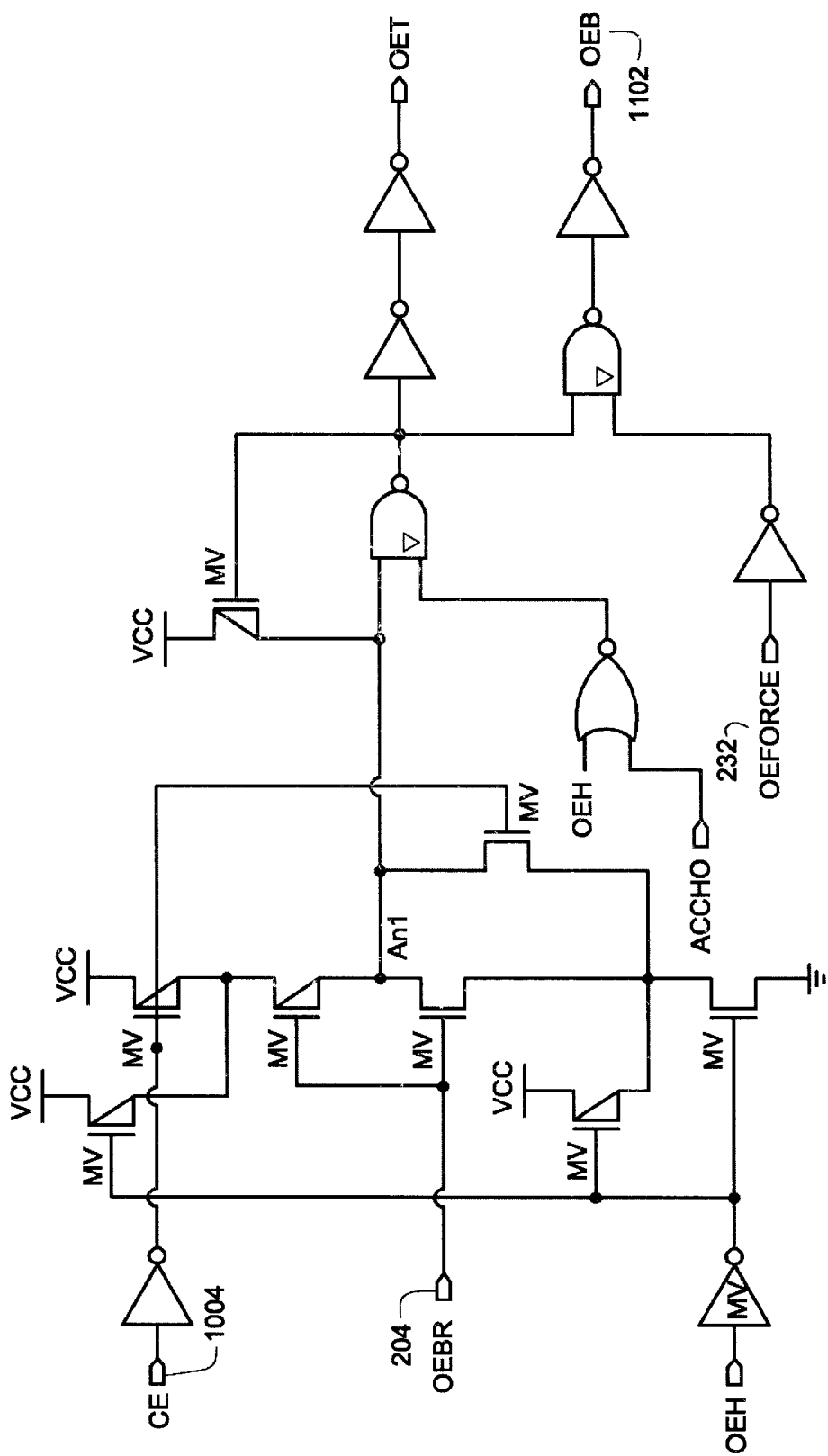
Figure 11 WOBUF

Figure 13  RBUSYDR

Figure 16 VPX

Figure 17  XDECEND

Figure 19  US AMP

Figure 20 LSAMP

Figure 24 OBUFDR

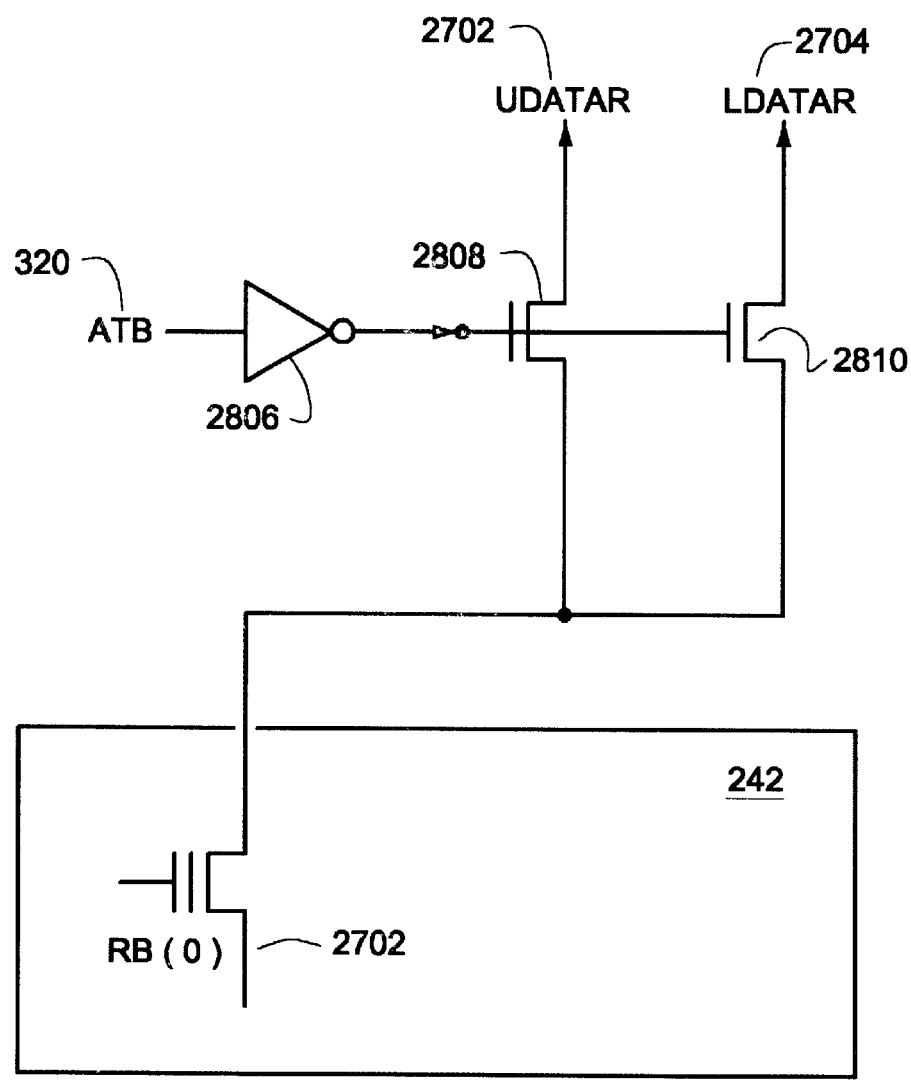
Figure 28 REFPBL

ARRAY VT MODE IMPLEMENTATION FOR A SIMULTANEOUS OPERATION FLASH MEMORY DEVICE

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Computers, personal digital assistants, cellular telephones and other electronic systems and devices typically include processors and memory. The memory is used to store instructions (typically in the form of computer programs) to be executed and/or data to be operated on by the processors to achieve the functionality of the device. In some applications, the systems and devices may require that the instructions and/or data be retained in some form of a permanent/non-volatile storage medium so that the information is not lost when the device is turned off or power is removed. Exemplary applications include computer BIOS storage and diskless handheld computing devices such as personal digital assistants.

One way to provide such non-volatile storage capability is to include a mass-storage device such as a hard disk drive. Hard disk drives are mechanical devices which store data on rotating magnetic platters. However, such devices may be difficult to fit in small systems and may have significant reliability, cost and manufacturing constraints. An alternative to such devices are integrated-circuit based non-volatile memories. One type of non-volatile memory that can be used is Erasable Programmable Read Only Memory ("EPROM"). While conventional EPROM's provide reliable non-volatile storage, they may not be able to be reprogrammed in the field in a practical manner. For example, EPROM's typically require exposure to ultraviolet light to erase them which may require that the EPROM memory chips be removed from the device. Once erased and reprogrammed, they are placed back in the device. In many applications, removing the memory to reprogram the device is not practical. In addition, besides not being easily reprogrammed, EPROM's may not have satisfactory data storage densities.

To avoid the complexity of EPROM's and to provide a device that can be reprogrammed in the field, many electronic designs use Electrically Erasable Programmable Read Only Memory ("EEPROM"), Static Random Access Memory ("SRAM") or flash memory, which can be reprogrammed electrically and without special hardware. SRAM is not technically a form of non-volatile memory but can be used in some applications requiring non-volatile capability.

EEPROM has the disadvantages of being expensive and having a very limited life cycle, i.e. an EEPROM can only be erased and rewritten a limited number of times before the device becomes non-functional. SRAM offers high operating speeds but only maintains its contents as long as power is supplied, therefore requiring a battery or other power source. This necessitates additional hardware to maintain power to the SRAM to preserve the stored contents which increases manufacturing cost and complexity. Further, the additional hardware may put undesirable constraints on the physical size of the design. In addition, EEPROM's and SRAM's may not have as high a data storage density as compared to other forms of storage. Therefore, where cost, size or density is a factor, flash memories are preferred because they may be simpler to reprogram in the field then EPROM's, less expensive than EEPROM's, easier to implement than battery-backed SRAM's and available in higher data storage densities.

Flash memory (or flash RAM) is a form of non-volatile storage which uses a memory cell design with a floating gate. High voltages are applied to the memory cell inputs to program/store charge on the floating gate or to erase/remove charge from the floating gate. Programming occurs by hot electron transfer to place charge on the floating gate while erasure makes use of Fowler-Nordheim tunneling in which electrons pierce through a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM). Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

Prior flash memories could only be erased by erasing the entire memory chip also known as bulk erasure. Byte by byte erasure was not possible. To somewhat alleviate this problem, modem flash memory is typically divided logically into blocks called "sectors" where each sector contains a portion of the total bytes of data storage available. For example, a typical flash memory may have 32 megabits of total storage and be logically broken down into 64 sectors, each sector containing 64 Kilobytes of data (one byte being equal to eight bits). This arrangement allows for the option of erasure of one sector at a time in addition to bulk erasure of the entire memory. While typical flash memories are still incapable of byte by byte erasure, data in the flash memory may still be programmed byte by byte (or sometimes word by word, where a word equals four bytes) depending on the implementation. It will be appreciated that the granularity by which a flash memory device can be programmed or erased may vary and that granularities down to bit level programming/erasure are contemplated.

In order to program and/or erase a flash memory, typically a complex process must be followed. For example, before erasing a particular sector, that sector must be programmed (known as "pre-programming"). These steps of erasing and programming involve complex application of high voltages to the memory cells for specified periods of time and in particular sequences. Many flash memories provide embedded state machines which perform the complex programming and erasing operations automatically. These processes of programming and erasing a flash memory may take a long time to complete. A typical erase sequence can take anywhere from 0.7 seconds up to 15 seconds per sector. To erase an entire chip can take up to 49 seconds depending on the number of sectors. While programming is much faster, on the order of 7 to 300 microseconds per byte, it is still slow compared to other memory devices. Programming an entire chip can still take up to 120 seconds (including the time to verify the data) depending on the capacity of the chip. Typically, standard Dynamic Random Access Memory ("DRAM") offers write access times on the order of nanoseconds, a difference between flash memory of many orders of magnitude.

This complex nature of programming and erasing flash memory devices leads to a major problem in that they do not provide sufficiently fast write access which then affects read accesses. For example, conventional flash memory devices typically do not allow a processor to perform a read operation while a program or erase operation is underway in the flash memory device. In most implementations, the processor is required to periodically poll a status register of the flash memory device to detect the end of the program or erase operation before initiating a read operation to the flash memory device.

Unfortunately, as noted above, the programming and erase cycle times for typical flash memory devices are orders of magnitude greater than acceptable write access times of a conventional random access main memory using, for example, Dynamic Random Access Memory ("DRAM"). Such long latencies associated with programming or erase operations can lock up the operating system and prevent the system from functioning for unacceptably long time intervals if the flash memory is the only memory in the electronic system. Some prior flash memories allow erase suspend operations in order to address this problem. Erase suspend allows the processor to pause an erase operation so another sector can be read. However, such memories typically still impose a suspend latency interval of several microseconds before a read operation can be initiated. A typical suspend latency interval is from 0.1 to 20 microseconds.

Prior systems may employ multiple flash memory devices in an attempt to prevent such operating system lock up. In such systems, the processor usually has read access to one of the flash memory devices while other flash memory devices are undergoing a program or erase operation. However, such systems typically suffer from high costs because multiple flash memory devices are implemented even though the capacity of a single flash memory device may accommodate the needs of the particular electronic device.

Another prior art system uses a flash memory in combination with an EEPROM memory. This system allows a read operation of one of the memories while writing to the other. However, the size of an EEPROM memory cell is significantly larger than that of a flash memory cell which reduces the amount of storage that can be placed on the memory chip. Further, there are significant design and manufacturing complexities involved with integrating two different memory technologies on the same chip. Therefore, a device which uses an EEPROM in combination with a flash memory will typically be more expensive both to design and manufacture.

In addition, programming and erasing a flash memory involves higher than normal voltages as compared to performing read operations. The use of these higher than normal voltages can cause problems when trying to implement the capability to simultaneously read while programming/erasing. Such problems include difficulties in distributing the high voltages required for the program and erase operations along with normal voltage for read operations and handling increased noise induced on the read sense outputs by the use of high voltages elsewhere within the device. Further, depending on the implementation, redundant logic may also be employed which introduces further complexities.

Accordingly, there is a need for an efficiently designed and manufacturable flash memory device that allows simultaneous read and write operations.

SUMMARY OF THE INVENTION

The present invention is defined by the following claims, and nothing in this section should be taken as a limitation on those claims. By way of introduction, the preferred embodiments described below relate to an array threshold voltage ("Vt") test mode for a flash memory device. The test mode utilizes the existing read data path of the flash memory device. During the test mode, the user places an address and a test voltage on inputs to the device. This test voltage is routed directly to the gates of the flash memory transistors selected by the address. If the test voltage is greater than the Vt of any of the selected transistors, those transistors will turn on and a logical 1 will be output from the device for those bit locations. If the test voltage is less than the Vt, the transistors will not turn on and a logical 0 will be output from the device for those bit locations. By varying the test voltages and the addresses, the Array Vt distribution can be determined for the entire device. This test mode is efficiently implemented using the existing read path logic and provides a way to test the Vt for the entire device without requiring a substantial amount of dedicated logic. Further, the Array Vt distribution results provide an efficient way to salvage defective flash memory devices as well as evaluate the fabrication process and prevent further defective flash memory devices.

BRIEF DESCRIPTION OF THE DRAWINGS

FIG. 7 depicts a schematic diagram of a lower bank timing circuit for use with the flash memory chip of FIG. 2.

FIG. 8 depicts a schematic diagram of an upper bank timing circuit for use with the flash memory chip of FIG. 2.

FIG. 9 depicts a schematic diagram of an output enable test logic circuit for use with the flash memory chip of FIG. 2.

FIG. 10 depicts a schematic diagram of a chip enable buffer circuit for use with the flash memory chip of FIG. 2.

FIG. 11 depicts a schematic diagram of an output buffer enabling circuit for use with the flash memory chip of FIG. 2.

FIG. 28 depicts a schematic diagram of a reference array multiplexer circuit for use with the flash memory chip of FIG. 2.

DETAILED DESCRIPTION OF THE PRESENTLY PREFERRED EMBODIMENTS

Herein, the phrase "coupled with" is defined to mean directly connected to or indirectly connected with through one or more intermediate components. Referring now to the Figures and in particular, FIG. 1, there is schematically shown a flash memory device 100 according to the present invention that provides for reading while simultaneously undergoing a program or erase operation. The memory device 100 according to the present invention may include one or more components of the memory devices disclosed in U.S. Pat. No. 5,867,430 entitled "BANK ARCHITECTURE FOR A NON-VOLATILE MEMORY ENABLING SIMULTANEOUS READING AND WRITING," to Chen et al and U.S. Pat. No. 5,847,998 entitled "NON-VOLATILE MEMORY ARRAY THAT ENABLES SIMULTANEOUS READ AND WRITE OPERATIONS," to Van Buskirk, both of which are herein incorporated by reference and further describe the implementation and operation of a device of this type. The memory device 100 may also include one or more components of such exemplary flash memory devices capable of simultaneous read and write operation as the Am29DL162C and Am29DL163C 16 megabit ("Mb") flash memory chips and the Am29DL322C and Am29DL323C 32 Mb flash memory chips manufactured by Advanced Micro Devices, Inc. located in Sunnyvale, Calif. For more detail regarding these exemplary flash memory chips, refer to "Am29DL322C/Am29L323C 32 Megabit (4M×8-Bit/2M×16-Bit) CMOS 3.0 Volt-only, Simultaneous Operation Flash Memory" Datasheet and "Am29DL162C/Am29L163C 16 Megabit (2M×8-Bit/1M×16-Bit) CMOS 3.0 Volt-only, Simultaneous Operation Flash Memory" Datasheet. While the exemplary devices disclosed above have capacities of 16 or 32 Mb, it will be appreciated that the embodiments disclosed herein are equally applicable to devices with higher bit densities such as 64 or 128 Mb devices.

In a typical embedded application of the above exemplary simultaneous operation capable flash memory 100, the available data storage space can be structured to store data and boot code in one bank and control code in another bank. The control code, which can contain command sequences which tell one bank, for example, bank 196, to program/erase data sectors, can reside as executable code in the alternate bank, for example bank 194. While the first bank is being programmed/erased, the system can continue to execute code from the alternate bank to manage other system operations. Similarly, depending on the system implementation, the CPU can also execute code from the first bank while the alternate bank undergoes a program/erase. There is no bank switching latency and no need to suspend the program/erase operation to perform the read. This minimizes the CPU's read/write cycle time, maximizes data throughput and reduces overall system cost by eliminating the need for additional hardware. It will be appreciated that while the exemplary devices have two banks of memory cells, devices with more than two banks are contemplated.

Figure 1:
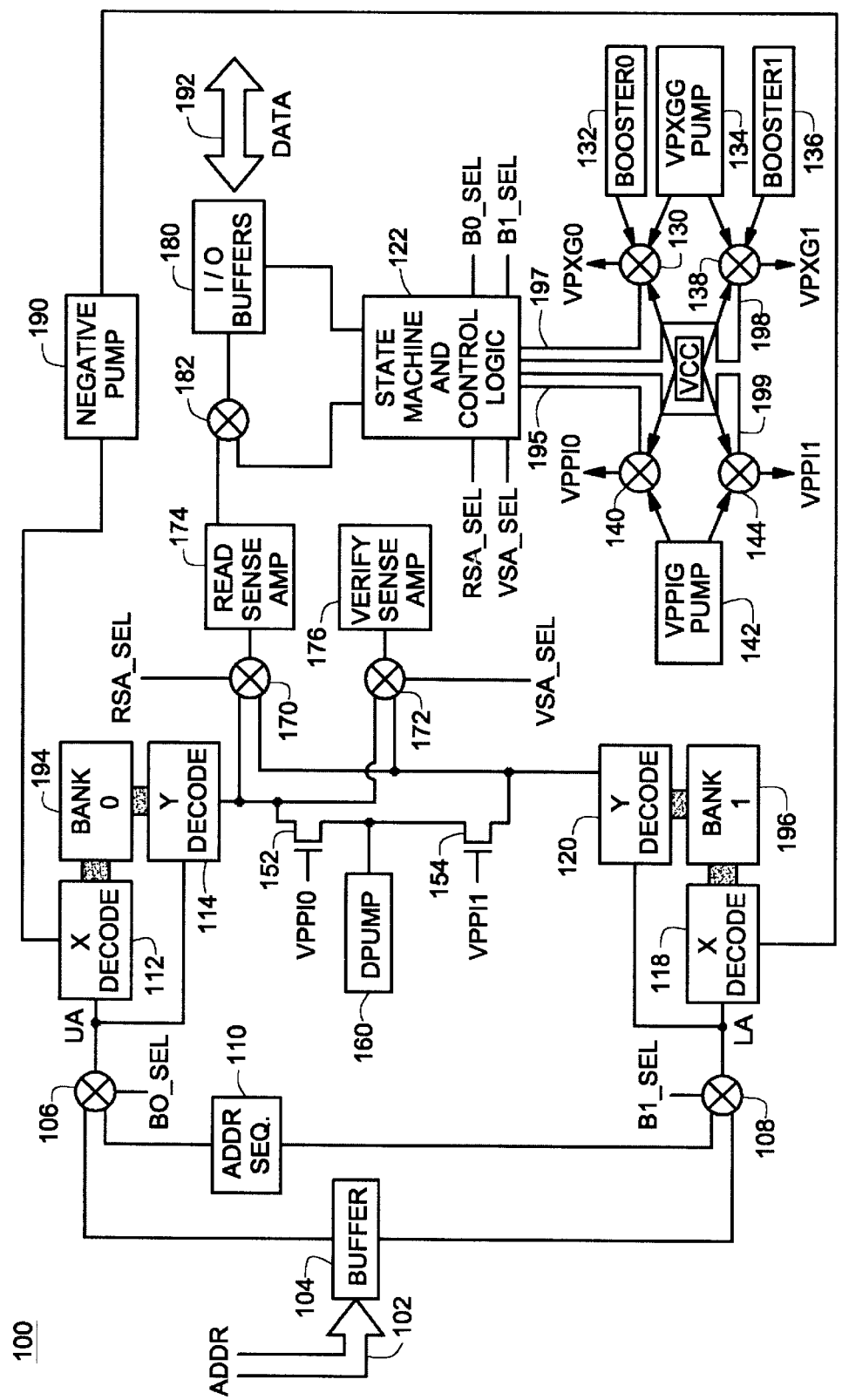
FIG. 1 depicts a block diagram of a flash memory chip according to the present invention that is capable of simultaneous reading and writing.

Again referring to FIG. 1, the memory device 100, according to an embodiment of the present invention with a capacity of 32 Mb and operating in word addressable mode, includes a 21 bit address input 102, a 16 bit data input/output ("DATA") 192, power inputs (not shown in FIG. 1) and control inputs (not shown in FIG. 1). It will be appreciated that the memory device 100 with a capacity of 16 Mb only requires 20 address bits and when operating in byte mode, the 32 Mb device 100 requires 22 address bits and the 16 Mb requires 21 address bits. The control inputs include Chip Enable, Output Enable, and Write Enable. The Chip Enable signal activates the chip's control logic and input/output buffers. When Chip Enable is not asserted, the memory device operates in standby mode. Output Enable is used to gate the outputs of the device through I/O buffers during read cycles. Write Enable is used to enable the write functions of the memory device. In one embodiment, all of the components of FIG. 1 are contained on a single integrated circuit chip. Note that address and control inputs for the exemplary flash memory chips are dependent on memory density and interface implementations. It will be appreciated that the disclosed embodiments can work with higher memory densities and alternate interface implementations with their accompanying alternate address and control input configurations.

The memory device 100 further includes address buffer 104, address multiplexers 106 and 108, address sequencer 110, X logical address decoders 112 and 118, Y logical address decoders 114 and 120, memory array Banks 0 and 1 denoted as 194 and 196 respectively, Dpump 160, data multiplexers 170 and 172, read sense amplifiers 174, verify sense amplifiers 176, negative pump 190, output multiplexer 182, state machine and control logic 122, input/output buffers 180, VPPIG Pump 142, booster 0 denoted as 132, VPXGG Pump 134, booster 1 denoted as 136 and power multiplexers 130, 138, 140 and 144. The address input 102 is received by the address buffer 104, which sends the address to the address multiplexer 106 for bank 194 and the address multiplexer 108 for bank 196. The address sequencer 110 is controlled by the state machine and control logic 122. In one embodiment, the address sequencer 110 is part of the state machine and control logic 122. The output of the address sequencer 110 is an address which is sent to both multiplexer 106 and multiplexer 108. The address sequencer 110 is used to generate sequential addresses during an erase sequence. The output of the multiplexer 106, upper address UA, is communicated to the X address decoder 112 and the Y address decoder 114. The output of the multiplexer 108, lower address LA, is sent to the X address decoder 118 and the Y address decoder 120. The multiplexer 106 chooses between the address from the buffer 104 and the address from the address sequencer 110 in response to a control signal B0_sel. The multiplexer 108 chooses between the address from the address buffer 104 and the address from address sequencer 110 based on a control signal B1_SEL. The selection signals B0_SEL and B1_SEL are generated by the state machine and control logic 122.

Bank 194 and bank 196 are arrays (or sets) of flash memory cells (operation of these individual flash memory cells is discussed in more detail below). The banks 194, 196 are organized by words and then by sectors and can either be byte or word addressable. It will be appreciated by those skilled in the art that other types of non-volatile memory are also within the scope of the present invention. The address decode logic for bank 194 includes the X address decoder 112 and the Y address decoder 114. The X address decoder 112 includes a word line decoder and sector decoder. The word line decoder receives address bits UA[6:14] and the sector decoder receives address bits UA[15:20]. The Y address decoder 114 includes a bit line decoder and Y bit line gating. The bit line decoder receives address bits UA[0:5].

The address decode logic for bank 196 includes the X address decoder 118 and the Y address decoder 120. The X address decoder 118 includes a word line decoder and a sector decoder. The word decoder receives address bits LA[6:14] and the sector decoder receives address bits LA[15:20]. The Y address decoder 120 includes a bit line decoder and Y bit line gating. The bit line decoder receives address bits LA[0:5]. In one embodiment, the address buffer 104 includes a latch to store the address being decoded. In another embodiment, the latch can be part of the decoders 112, 114, 118, 120.

FIG. 1 further shows a multiplexer 130 with three inputs: booster zero 132, VPXGG pump 134 and Vcc. The VPXGG pump 134 is a positive power supply for generating and supplying a regulated positive potential to the control gate of selected flash memory cells via the word lines. Many different voltage pumps known in the art are suitable for use in the present invention. A more detailed explanation of one technology which can be included in VPXGG pump 134 can be found in U.S. Pat. No. 5,291,446, "VPP POWER SUPPLY HAVING A REGULATOR CIRCUIT FOR CONTROLLING A REGULATED POSITIVE POTENTIAL" to Van Buskirk et al, the entire contents of which are incorporated herein by reference. Booster 132 is used to boost the word line during reads. The multiplexer 130 receives a selection signal 197 from state machine and control logic 122 and chooses one of its three inputs to send to the word lines of bank 194 via the X address decoder 112. The output of the multiplexer 130 is labeled as VPXG0. FIG. 1 is drawn to show the three inputs 132, 134 and Vcc connected to a multiplexer in order to simplify the disclosure. A more detailed description of one exemplary implementation can be found in U.S. Pat. No. 5,708,387, "FAST 3STATE BOOSTER CIRCUIT", to Cleveland et al, the entire contents of which are incorporated herein by reference. Many booster circuits and selection circuits known in the art are suitable for use in the present invention.

FIG. 1 also includes another multiplexer 138 having three inputs: booster one denoted as 136, VPXGG pump 134 and Vcc. Booster 136 is similar to, booster 132. The multiplexer 138 operates in a similar fashion to multiplexer 130, and receives its selection signal 198 from the state machine and control logic 122. The output of multiplexer 138 is VPXG1 which is sent to the word lines of bank 196 via the X address decoder 118. The purpose of the multiplexers 130 and 138 is to switch between the three power lines depending on the operation being performed on the particular bank of memory cells.

The VPPIG pump 142 is a high voltage pump used to pass high voltage to the drain of the memory cells. The output of the VPPIG pump 142 is sent to multiplexer 140 and multiplexer 144. Both multiplexers also have Vcc as an input. Multiplexers 140 and 144 switch between inputs based on signals 195 and 199 from the state machine and control logic 122. The output of multiplexer 140 is VPPI0 and the output of multiplexer 144 is VPPI1. During a normal read operation, VPPI1 and VPPI0 are connected to Vcc. VPPI0 is connected to the gate of an N-channel transistor 152. VPPI1 is connected to the gate of an N-channel transistor 154. The source of transistor 152 is connected to Y address decoder 114, multiplexer 170 and multiplexer 172. The drain of transistor 152 is connected to the Dpump 160 and the drain of transistor 154. The Dpump 160 is a drain power supply. Various drain power supplies, known in the art, can be used for the present invention. One exemplary drain pump is disclosed in U.S. Pat. No. 5,263,000, "DRAIN POWER SUPPLY", to Van Buskirk, et al., the entire contents of which are incorporated herein by reference. The source of transistor 154 is connected to multiplexer 170 and multiplexer 172. The source of transistor 154 is also connected to Y address decoder 120 for purposes of accessing the bit lines in bank 196. The connections to multiplexers 170 and 172 provide a path for reading data from bank 194 and bank 196. Multiplexer 170 uses the signal RSA_SEL from the state machine and control logic 122 to selectively choose one of the two input signals to communicate to the read sense amplifiers 174. Multiplexer 172 uses the selection signal VSA_SEL from the state machine and control logic 122 in order to selectively communicate one of its two input signals to the verify sense amplifiers 176. Thus, the two transistors (152 and 154) and the two multiplexers (170 and 172), are used to selectively pass voltages to the drains of selected cells in bank 194 or bank 196 and to selectively read data from either bank 194 or bank 196. For the sake of clarity, the implementation of multiplexers 170 and 172 is illustrative only. Some of the implementation details are not shown in FIG. 1. In the memory device 100, there are actually two sets of sense amplifiers, one set for each bank 194, 196. There are also two sets of verify sense amplifiers. Data from the banks is multiplexed from each bank 194 or 196 to either its read sense amplifier or its verify sense amplifier. When a bank 194 or 196 is using its read sense amplifier, its verify sense amplifier is turned off and vice versa. It will be appreciated that there are many ways to multiplex multiple data sources among multiple destinations.

Data from either bank 194 or bank 196 can be communicated to either the read sense amplifiers 174 or the verify sense amplifiers 176. Both sense amplifiers are in communication with the state machine and control logic 122. While data from bank 194 is communicated to the read sense amplifiers 174, data from bank 196 can be communicated to the verify sense amplifiers 176. While data from bank 194 is communicated to the verify sense amplifiers 176, data from bank 196 can be communicated to the read sense amplifiers 174. The output of the verify sense amplifiers 176 is sent to the state machine and control logic 122, which is used to verify that a particular byte has been programmed or erased. Note that in the memory device 100, the preferred implementation of the read sense amplifiers 174 provides two sets of sense amplifiers, one for each bank 194, 196. Only the sense amplifiers for the bank 194 or 196 undergoing a read operation are active during the read operation. The verify sense amplifiers 176 of the memory device 100 also have two sets of verify amplifiers, one for each bank.

Data from the read sense amplifiers 174 is sent to multiplexer 182. A second input of the multiplexer 182 includes device 100 status information from the state machine and control logic 122 such as whether or not a program or erase is in progress. The selection signal for multiplexer 182 is provided by the state machine and control logic 122.

I/O buffers 180 are used to pass data out and receive data into memory device 100. While a read is being performed on one of the banks, multiplexer 182 will communicate output data from read sense amplifiers 174 to I/O buffers 180. During an erase of program sequence, multiplexer 182 will communicate status information to I/O buffers 180 so that an outside processor can poll the memory device 100 for the status in regard to the erase or program.

The memory device 100 also includes a negative pump 190 that is used to generate a relatively high negative voltage to the control gates of selected memory cells via the word lines of either bank 194 or bank 196, as selected by the state machine and control logic 122. The negative pump 190 is in communication with the X address decoders 112 and 118. One example of a negative pump can be found in U.S. Pat. No. 5,612,921, "LOW SUPPLY VOLTAGE NEGATIVE CHARGE PUMP", to Chang et al, the entire contents of which are incorporated herein by reference.

The state machine and control logic 122 provides the control for read, program and erase operations. Many of the selection lines used to select between bank 194 and bank 196 are controlled by the state machine and control logic 122. Alternatively, the output from the X and Y address decoders 112, 114, 118, 120 can be used to select between banks of memory cells.

The memory device 100 is programmed using an embedded programming sequence and is erased using an embedded erase sequence. The embedded sequences allow a processor to initiate a program or erase sequence and perform other tasks while the program and erase sequences are being carried out. The embedded program and erase sequences are controlled by the state machine and control logic 122, which uses a command register to manage the commencement of either sequence. The erase and programming operations are only accessed via the command register which controls an internal state machine that manages device operations. Commands are written to the command register via the data inputs 192 to the memory device 100.

While one bank is being programmed, the other bank can be accessed for a read operation. For example, during a program of a byte in bank 196, the state machine and control logic 122 would cause multiplexer 108 to select the address from buffer 104 for communication to decoders 118 and 120. Further, the state machine and control logic 122 would store the data byte to be programmed from the I/O buffers 180 for verification when the programming completes. The output of bank 196 would be sent to the verify sense amplifiers 176 via multiplexer 172 for comparison with the stored input data. During a simultaneously initiated read operation to bank 194, the state machine and control logic 122, after storing away the data to be programmed, instructs multiplexer 106 to select the address from the buffer 104 for communication to the X and Y address decoders 112 and 114. The output of bank 194 would be sent to the read sense amplifiers 174 via multiplexer 170. The output of the read sense amplifiers 174 would be sent, via multiplexer 182 to the I/O buffers 180 and then to the data bus 192.

Similarly, during an erase of a sector in bank, 194, the state machine and control logic 122 would cause multiplexer 106 to select the addresses from the address sequencer 110. The address sequencer 110 would be used to cycle through all the bytes in a particular sector to make sure that each byte is preprogrammed. The sector is subsequently bulk erased. After erasure, the address sequencer 110 would be used to generate addresses to verify each byte of this erased sector. While bank 194 is being erased and multiplexer 106 is selecting an address from the address sequencer 110, a read operation can be carried out in bank 196 by using multiplexer 108 to select the address from the buffer 104 rather than an address from address sequencer 110. During the verify operation of the erase method for bank 194, the state machine and control logic 122 would be verifying the data using the verify sense amplifiers 176, while read data from bank 196 would be communicated to the read sense amplifiers 174. Thus, each bank has two input address paths and two output data paths that can be multiplexed so that either bank can be read from while the other bank is simultaneously being written to.

In the memory device 100, each memory cell, within the banks 194 or 196, includes a nor-type floating gate transistor. It will be appreciated by those skilled in the art, however, that there are many ways to implement a flash memory cell and that the configurations and operating characteristics may vary. It will further be appreciated that the embodiments disclosed herein are generally applicable and not limited to one particular implementation of a flash memory cell. The exemplary transistor has three connections called the source, drain and control gate. In a typical flash memory array, the control gates of the memory cells are connected to the word lines of the array which are used to address the data stored in the array. The sources are selectively connected to ground (for a read operation) depending on which bits are to be read. The drains are connected to the bit lines which are used to sense/read the stored data out of the array.

During an erase operation, the source input of the memory cell transistor is connected to a high positive voltage, the drain/bit line is left to float and the control gate/word line is connected to a relatively high negative voltage supplied by the negative pump 190. An exemplary high positive voltage applied to the source during an erase is approximately 5 volts and an exemplary high negative voltage applied to the control gate/word line by the negative pump 190 is approximately minus 9 volts although other voltages and input combinations can be used. Based on this input configuration, any charge stored on the floating gate of the memory cell transistor will discharge by flowing out to the source due to Fowler-Nordheim Tunneling.

During a program operation, the source input of the memory cell transistor is connected to ground, the drain/bit line is connected to a high positive voltage provided by the VPPIG Dpump drain power supply 142 and the control gate/word line is connected to a high voltage provided by the VPXGG pump positive power supply 134. An exemplary high voltage applied to the drain by the VPPIG 142 is approximately 5 Volts while an exemplary high voltage applied to the control gate by the VPXGG 134 pump is approximately 9 Volts. It will be appreciated by those skilled in the art that other voltage and input combinations can also be used. Based on this input configuration, charge will flow by hot electron transfer to the floating gate of the memory cell transistor and accumulate there.

While programming and erasing the memory cell require higher than normal voltages, reading from the cell only requires the availability of the normal supply voltage. To read from the memory cell, the source is connected to ground (also referred to as Vss) and the control gate/word line are connected to the booster power supplies 132, 136. Prior to selecting the transistors for a read, the bit lines are charged up via the Dpump 160. When the cells turn on (if erased), they will connect their respective bit line to ground, grounding out the bit line. The current value of the memory cell is then sensed from the drain/bit line connection. There is a booster power supply 132 for bank 194 and a booster power supply 136 for bank 196. The booster power supplies 132, 136 are used to boost the word lines of bank 194 or bank 196 during a read operation. An exemplary Vcc supply voltage is 3.0 Volts although other supply voltages are known in the art. An exemplary booster voltage is 5.0 Volts, although the use of the other voltages on the control gate for read operations is possible. If there is charge stored on the floating gate, i.e. the memory cell has been programmed, the flow of current from the drain to the source (ground) will be inhibited and the memory cell will read as a logical "0". If the memory cell has been erased, there will be no charge stored on the floating gate and with a voltage applied to the control gate greater than the threshold voltage of the transistor, current will flow from the drain to the source and the memory cell will read as a logical "1". Note that a transistor that is on, grounds its respective bit line. Data read out of the array is considered in its complimentary form, therefore the grounded bit lines are interpreted as logical 1's and the non-grounded bit lines are considered logical 0's.

Application of the particular voltages necessary for each operation is handled by the state machine and control logic 122. This logic 122 controls the multiplexers 130, 138, 140, 144 that place the proper voltages from the various power supplies 132, 134, 136, 142 and Vcc on the memory cell inputs depending on the desired function.

While the total capacity of the simultaneous read and write capable flash memory device 100 is 16 or 32 MB or higher, how that capacity is distributed among the available banks is variable. Users of simultaneous read and write capable flash memory may need different bank partition sizes depending on their applications. To meet the varying needs of users, the flash memory device 100 preferably implements a sliding bank architecture. This architecture allows the simplified design and manufacture of simultaneous flash memory devices with varied bank partition sizes. To alter the bank sizes, only a single metal layer of the chip needs to be altered. For a more detailed discussion of the sliding bank architecture, refer to co-pending and commonly assigned U.S. patent application Ser. No. 09/159,142, "SIMULTANEOUS OPERATION FLASH MEMORY DEVICE WITH A FLEXIBLE BANK PARTITION ARCHITECTURE", filed Sep. 23, 1998, U.S. patent application Ser. No. 09/159,029, "METHOD OF MAKING FLEXIBLY PARTITIONED METAL LINE SEGMENTS FOR A SIMULTANEOUS OPERATION FLASH MEMORY WITH A FLEXIBLE BANK PARTITION ARCHITECTURE", filed Sep. 23,1998 and U.S. patent application Ser. No. 09/159,489, "BANK SELECTOR CIRCUIT FOR A SIMULTANEOUS OPERATION FLASH MEMORY DEVICE WITH A FLEXIBLE BANK PARTITION ARCHITECTURE", filed Sep. 23, 1998, the entire contents of each of which are incorporated herein by reference. The sliding bank architecture enables the memory device 100 to be produced in many different configurations with only a single mask change in one of the final steps of production. In the case where the flash memory device 100 has a capacity of 32 megabits (Mb), partitions where bank 194 has a capacity 4 or 8 Mb and bank 196 has a capacity of 28 or 24 Mb respectively, can be used. In the case where the flash memory device 100 has a capacity of 16 Mb, partitions where bank 194 has a capacity of 2 or 4 Mb and bank 196 has a capacity of 14 or 12 Mb respectively, can be used. This has the advantages that many different configurations of the flash memory device 100 can share much of the same basic design, process and manufacturing expense.

During manufacturing of the memory device 100, process variations and defects can occur. It is important to be able to test the finished device 100 prior to shipment to the customer and prior to fabricating more of the devices 100. This allows the potential to correct any minor defects in order to salvage the device 100 and to correct any fabrication problems before more defective devices 100 are manufactured. This testing includes both external and internal tests. The memory device 100 preferably provides several internal test features which can be used to ensure that the device 100 is fully functional. In addition, results from internal testing can preferably be used to verify and optimize the fabrication process for other devices 100. One aspect of internal testing and subsequent optimization involves the memory banks 194, 196.

As was discussed above, the memory banks 194, 196 are preferably implemented as arrays of flash memory cells. Each cell includes a flash memory transistor which stores a data bit. When a particular flash memory transistor is programmed, charge stored on the floating gate prevents the transistor from turning on by inhibiting current flow from the source to the drain when a voltage is placed on the gate. In this case, the data bit will read as a logical 0. When the flash memory transistor is erased, the lack of charge on the floating gate will allow a voltage placed on the gate of the transistor to turn on the transistor, and current will flow from the source to the drain. In this case, the cell will read as a logical 1. The voltage required to be placed on the gate input in order to turn on the erased flash memory transistor must exceed a threshold voltage, also referred to as Vt. This turn on voltage is actually the voltage potential between the gate input and the source input, also referred to as Vgs. If Vgs is greater than Vt, the transistor will turn on. If Vgs is less than Vt, the transistor will not turn on. In the memory device 100, a flash memory cell in the erased state has Vt of approximately 2–2.5 Volts. Flash memory transistors which are programmed also have a Vt but it is much higher than that of an erased cell. For a cell in the programmed state, the Vt is approximately 4–5 Volts.

In one embodiment of the present invention, an Array Vt test mode is provided. The memory device 100, with a storage capacity of 32 Mb has 32 million flash memory transistors in its memory banks 194, 196. It is desirable that all of the transistors have the same Vt value, however process variations and defects in the manufacturing of the device 100 will result in the various flash memory transistors of the memory banks 194, 196 having different Vt values. Deviations in the Vt across this many transistors can greatly affect the device's 100 operation. It is, therefore, important in optimizing the fabrication process of the device 100 to know the distribution of the different Vt values across the entire memory array of finished devices 100. Once the Vt distribution is determined, the information can be used to adjust the fabrication process for a more even and predictable Vt across the array. Further, where the Vt variation is not too large across the array, the manufactured devices 100 may be able to be salvaged despite the Vt variation by, for example, re-erasing the arrays of the devices 100. The testing for the distribution of Vt across the array can also detect other problems. When the transistors of the memory array are under stress, from frequent reading, programming or erasing, the floating gates of some of the transistors can actually gain charge. This will result in an increase in the Vt. If the amount of charge gained on the gate gets too excessive, the transistor will not be able to be turned on during a normal read operation. Determination of the Vt of the transistors during the array Vt test mode will detect any charge gain as this will be seen in an increased Vt for the particular cell. It will be appreciated that there are other problems which can be detected by knowing the Vt distribution.

During the Array Vt test mode, an operator, or alternatively an automated test machine, is able to test each flash memory transistor and determine its Vt. This is done by placing the device 100 in an Array Vt test mode which allows the operator to place external voltages directly on the gate input of a particular flash memory transistor and vary that voltage until the transistor turns on. For the memory device 100, this testing will be performed on each generation and even each lot of manufactured devices 100 to establish uniformity and locate any problems in the fabrication process. The Array Vt test mode is provided by the device 100 itself utilizing internal logic circuits incorporated into the design of the device 100.

The voltage is placed on the gate through an external pin of the device 100 which is routed directly into the flash memory banks 194, 196 during this test mode. The flash memory transistor to be tested is selected by placing its address on the address inputs 102 of the device 100. If the voltage placed on the gate is greater than the Vt of the selected transistors, the device 100, will output a logical 1 for the corresponding bit location otherwise it will output a logical 0. Each transistor is tested by changing the input address 102 to the device 100. In this way, each transistor can be accessed and have its Vt tested. Further, the accuracy by which each Vt is determined is entirely within user control as the user chooses which voltages to place on the various transistors' gate inputs as well as the degree in variation of that voltage. A finer degree of variation will result in a more accurate determination of the Vt. It will be appreciated that the voltage source used for testing can be either external to the memory device 100 or integrated internally. Further, the selection of transistors for testing and the application of voltages can be entirely automated either in an external test apparatus or internally to the device 100. In addition, the Vt can be determined by starting at a low voltage, 0 volts for example, and increasing the applied gate voltage until the transistor turns on (as described above) or by starting at a high voltage, Vcc (the chip supply voltage, 3 Volts or 2 Volts), for example, and decreasing the voltage until the transistor turns off. It will further be appreciated that the test methodology depends on the type of transistor used in the array. In the memory device 100, NOR type flash memory transistors are used however, NAND type transistors can also be used.

While the memory cells of the memory device 100 are first completely erased to determine the Vt of the erased cell, alternatively the cells could be programmed. While, as discussed above, the charge stored on the floating gate of a programmed transistor will inhibit the transistor from turning on, there is still a Vt where the transistor will turn on despite being programmed. Of course, this Vt will be much higher than the Vt of an erased cell. However, it may be of importance to know at what voltage a programmed cell will fail and turn on. This can be done with the disclosed embodiments because they allow any voltage to be placed on the gate input. The operator or automated test machine need only program all of the cells before testing. As well, only a sub set of cells which are going to be tested need to be programmed.

As used herein, the phrase "high logic level" is used to indicate a logical 1 and the phrase "low logic level" is used to indicate a logic level of 0. It will be understood that the signals underlying these representations are actually represented by voltage values. A signal is said to be "asserted" when it has a value which is significant to the logic it is driving. Some signals are asserted when they are at a low logic level (also referred to as "active low" and labeled with a bar over the signal name or a B appended to the end of the signal name) and some signals are asserted when they are at a high logic level (also referred to as "active high"). It will be appreciated that all forms of digital logic representations are contemplated including mixed logic and multi-state representations. It will further be appreciated that the underlying voltages of the logic signals may also vary, with exemplary values being 2 or 3 Volts representing logic 1 and 0 Volts representing logic 0.

Figure 2:
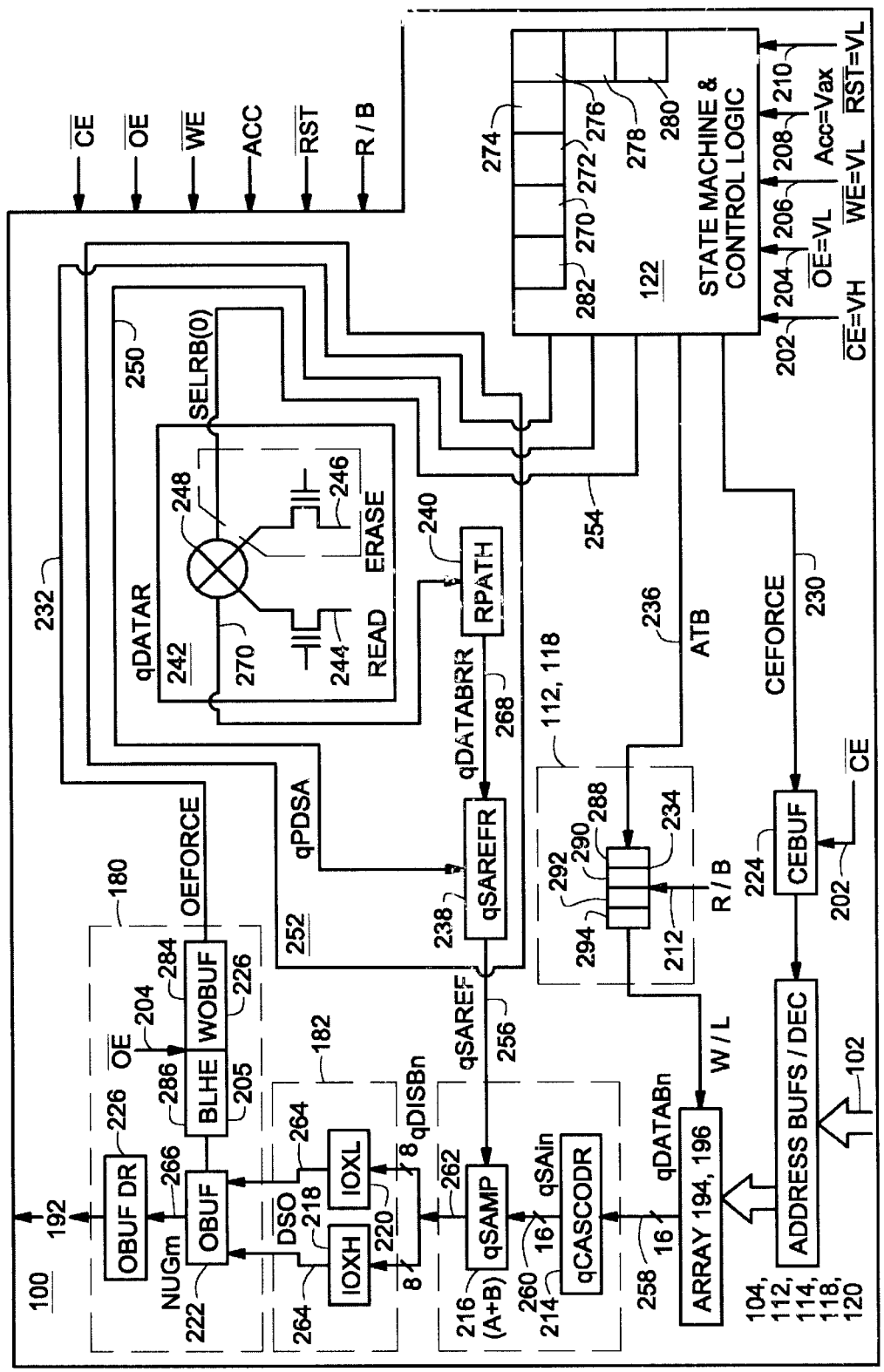
FIG. 2 depicts a block diagram of the flash memory chip of FIG. 1 showing the implementation of the Array Vt test mode.

Referring now to FIG. 2, there is shown a block diagram of the memory device 100 of FIG. 1 showing the signals and functional blocks of the Array Vt test mode. For the sake of clarity, a number of the components of FIG. 1 have been deleted in FIG. 2. In addition, for the sake of clarity, signals and functional blocks related to the upper or lower banks 194, 196 have been combined and are labeled with a "q" where q="U" for the upper bank 194 and q="L" for the lower bank 196. The memory device 100 further includes device inputs for a chip enable input 202 (active low and labeled "$\overline{CE}$"), an output enable input 204 (active low and labeled "$\overline{OE}$"), a write enable input 206 (active low and labeled "$\overline{WE}$"), an accelerate input 208 (labeled "ACC"), a reset input 210 (active low and labeled "$\overline{RST}$") and a read/busy input 212 (labeled "R/B").

In order to place the memory device 100 in to the Array Vt test mode, the user must set the chip enable input 202 to VH, the output enable input 204 to VL, the write enable input 206 to VH, the accelerate input 208 to Vax and the reset input 210 to VL. Where, preferably, VH is a high positive voltage greater than approximately 8.5 Volts, Vax is approximately 7 Volts and VL is a logical 0 or 0 volts. The accelerate input 208 provides a high voltage source for operation of the logic circuits involved in testing. It will be appreciated that the input configuration required to enable the Array Vt test mode is implementation dependent and that other input configurations and implementations may also be used. When in Array Vt test mode, the desired test voltage is placed on the read/busy input 212 and the address of the transistors to be tested is placed on the address inputs 102 of the device 100. The data outputs 192 will read out the results of the test. When the device 100 is in byte mode, the Array Vt test mode will test eight memory locations at a time and when in word mode, the Array Vt test mode will test 16 memory locations at a time. The data outputs 192 will show eight or 16 result bits depending on the mode where a logical 1 means that the input voltage on the read/busy input 212 is greater than Vt and a logical 0 means that the input voltage is less than the Vt. The addresses used to address various transistors in the array are either byte addresses or word addresses, thereby testing an entire byte (8) or word (16) of transistors at any given time. The memory device 100 includes a BYTE input pin (not shown) which, in both normal operation mode and Array Vt test mode, tells the device to operate either byte by byte or word by word. By setting the BYTE input pin to a logical 1, the device 100 is placed in word mode. In word mode, the device accepts a 21 bit address to address 2 bytes (16 bits/transistors) at once and outputs all 16 bits on the data outputs 192. By setting the BYTE input pin to a logical 0, the device 100 is placed in byte mode and accepts a 22 bit address. This addresses and outputs 1 byte at a time on the data output busses 192. Note that the disclosed Array Vt mode can work with addresses down to the bit level depending on the implementation of the addressing and read circuits of the device 100. The Array Vt test mode logic utilizes the existing address and read circuits with very little addition dedicated logic and therefore is address resolution independent.

FIG. 2 further shows other components of the device 100 which enable the Array Vt test mode. See FIGS. 3–29 and their accompanying discussion for more detail on the components shown in FIG. 2. The address inputs 102 of the device 100 are connected with the address buffering and decoding logic 104, 112, 114, 118, 120. These logic circuits are coupled with the memory banks 194, 196 and decode the address to select the particular memory cell transistors within the memory array. The memory banks 194, 196 are then connected to the sense amplifiers 174, via the signal paths 258 (labeled "qDATABn") which read the data from the memory cell transistors. This logic 104, 112, 114, 118, 120 is also coupled with the chip enable input 202 through the chip enable input buffer 224 so as to be active when the chip enable input 202 is asserted and shut off when the chip enable input 202 is de-asserted. The chip enable input buffer 224 is also under control of the state machine and control logic 122. As will be discussed below, the state machine and control logic 122 can assert a signal 230 (labeled CEFORCE) which will force the address buffering and decoding logic to turn on even if the chip enable input 202 is unasserted. This logic 104, 112, 114, 118, 120 is the same logic used in the normal read operation of the device 100.

The sense amplifiers 174 further include a pre-amplifier stage 214 (labeled "qCASCODR") and a final amplifier stage 216A, 216B (labeled "qSAMP") connected with the pre-amplifier stage via the signal paths 260 (labeled "qSAin"). There are preferably a set of 16 sense amplifiers 174 for each bank 194, 196 in the memory device 100. The sense amplifiers 174 connect to the input/output ("I/O") multiplexers 182 via the signal paths 262 (labeled "qDISBn"). The I/O multiplexers 182 include a high byte multiplexer 218 (labeled "IOXH") and a low byte multiplexer 220 (labeled "IOXL"). These multiplexers 218, 220 are connected to the sense amplifiers 174 for both banks 194, 196 and separately multiplex between the high byte and the low byte coming from each bank 194, 196 of the word which is being read from the memory array. In the memory device 100, there are preferably 8 low byte multiplexers 220 and 8 high byte multiplexers 218, 1 for each bit of the 2 byte word.

The I/O multiplexers 182 are connected to the output buffers 180 via the signal paths 264 (labeled "DSOn") which output the data to the device 100 data outputs 192. The output buffers 180 further include an output buffer 222 (labeled "OBUF") and an output buffer driver 226 (labeled "OBUFDR"). In the memory device 100, there are preferably 16 output buffers 222 and 16 output buffer drivers 226. The output buffer 222 buffers the data to be output and is under the control of the output enable input 204 to control whether data is output from the device 100 or not. The output enable input 204 is connected with an output buffer control circuit 228 which controls the output buffer 222. The output buffer control circuit 228 contains control circuits 284 and 286 (labeled "WOBUF" and "BLHE" respectively). The output buffer drivers 226 are connected to the output buffers 222 via the signal path 266 (labeled "NUGm") and are used to drive the output data signal through the physical pins of the device 100. The output buffer control circuit 228 is also connected to the state machine and control logic 122 by the signal 232 (labeled "OEFORCE"). As will be discussed below, the OEFORCE signal 232 allows the state machine and control logic to force the output buffers to turn on despite the value of the output enable input 204.

FIG. 2 also shows the word line control circuit 234 connected with memory array (banks 194, 196) and the read/busy input 212. The word line control circuit is also connected to the state machine and control logic 122 via the control signal 236 (labeled "ATB"). The word line control circuit 234 includes a lower erase select Vt circuit 288 (labeled "LERSELVT"), an upper erase select Vt circuit 290 (labeled "UERSELVT"), word line power selection circuits 292 (labeled "VPX") and word line drivers 294 (labeled "XDECEND"). As was discussed above, the memory array transistors are arranged in an array fashion. The drain of each memory cell transistor is connected to the Y decoding logic 114, 120 which further connects them to the sense amplifiers 174, the gates are connected to the X address decoder 112, 118 and the sources are grounded. To activate a particular memory cell transistor, the Y address decoder 114, 120 must decode the given address into the column in the memory bank 194, 196 in which the memory cell is located. Note that the memory device 100 is either byte or word addressable so that either an entire byte (8) of memory cells will be activated at any one time or an entire word (16) of memory cells will be activated. Once decoded, the Y address decoder 114, 120 will connect the drain connections of those memory cells to the sense amplifiers 174.

The X address decoder 112, 118 decodes the address into the row and selects the row in which the memory cell transistors are located. The combination of the column and row isolates the selected transistors as determined by the address. The X address decoder 112, 118 includes the word line control circuit 234. The word line control circuit 234 provides the gate voltage to the gates of the selected memory cell transistors for reading or other operations. If the state machine and control logic 122 asserts the ATB control signal 236, the word line control circuit 234 switches over from the normal gate voltage power supply and provides what ever voltage is on the read/busy input 212 directly to the gates of the selected memory cell transistors. In the memory device 100, there are preferably 65 word line control circuits, one for each sector of the array. The memory device 100 preferably has 65 sectors, 63 64-kilobit sectors, one 64-kilobit sector broken down into eight 8-kilobit boot sectors and one 64-kilobit secured sector.

Finally, FIG. 2, also shows the reference circuits 252 for the memory device 100. In order for the sense amplifiers 174 to properly sense the data from the memory array, the final amplifier stage 216A, 216B must compare the sensed value with a reference value. The final amplifier stage 216A, 216B uses a differential sense amplifier to accomplish this comparison. It will be appreciated that differential sense amplifiers are well known in the art. The sense amplifiers 174 are connected with the reference circuits 252, via the signal path 256 (labeled "qSAREF"), which provide the proper reference value. The reference circuits 252 include a reference array 242, a reference signal path 240 (labeled "RPATH") and reference sense pre-amplifiers 238 (labeled "qSAREFR"). The reference array 242 is connected to the reference signal path 240 via signal paths 270 (labeled "qDATAR"). The reference signal path 240 is connected to the reference sense pre-amplifiers 238 via signal paths 268 (labeled "qDATABRR").

In the memory device 100, there are preferably two sets of 16 reference sense pre-amplifiers 238, one set of 16 for each bank 194, 196. The reference sense pre-amplifiers 238 sense the voltage stored on the selected reference transistor cell 244, 246 and communicate that to the sense amplifiers

174. The reference sense pre-amplifiers are under control of the state machine and control logic 122 via the signal path 250 (labeled "qPDSA"). The qPDSA signal 250 powers down the sense amplifiers (turns them off) when it is asserted.

The reference signal path 240 includes specially isolated signal paths which carry the signals from the reference array 242 to the reference sense pre-amplifiers 238. The reference array 242 further includes a reference read cell 244, a reference erase cell 246 and a multiplexer 248. The reference read cell 244 and the reference erase cell 246 are specially isolated flash memory transistors. The reference erase cell 246 is maintained in an erased state and has pre-set low Vt. The reference read cell 244 is pre-set with a larger Vt. The multiplexer 248 is under control of the state machine and control logic 122 via the signal path 254 (labeled "SEL_RB(0)"). Depending on the operation underway in the device 100, the appropriate reference cell 244, 246 is selected for connection with the reference sense pre-amplifiers 174 via the RPATH signal path 240.

During Array Vt test mode, the reference erase cell 246 is connected to the reference signal path 240 and used for determining the Vt of the transistors under test by the sense amplifiers 174. The reference erase cell's 246 low Vt allows a more accurate determination of the actual Vt of the transistors undergoing test. The read reference cell 244 has a higher Vt because it is used for both, comparing with programmed cells and erased cells under the normal operating voltage. The read reference cell 244 is used to provide a more discriminating capability to the sense amplifiers 174.

Figure 3:
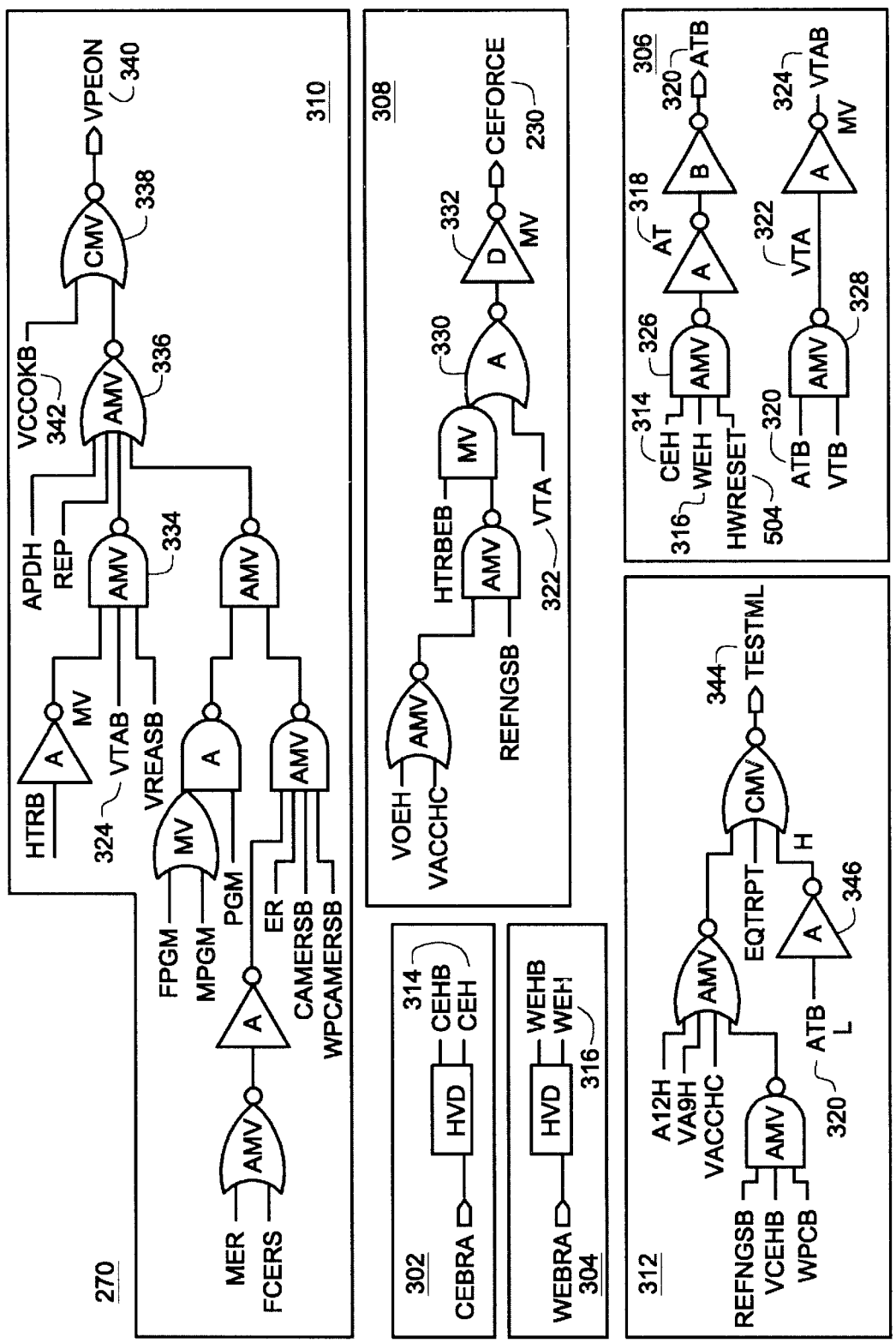
FIG. 3 depicts a schematic diagram of test logic circuits for use with the flash memory chip of FIG. 2.

Referring to FIG. 3, there is shown a schematic diagram of the test logic circuits 270, labeled "TEST_LOGIC". This logic is a part of the state machine and control logic 122. It contains the circuits which respond to the memory device 100 inputs and put the device 100 in Array Vt test mode. In the particular, the test logic circuits 270 include a chip enable high voltage detector 302, a write enable high voltage detector 304, an array test signal generator 306, a chip enable override circuit 308, a test power on signal generator 310 and a test mode signal generator 312.

The chip enable high voltage detector 302 is coupled with the chip enable input 202. The write enable high voltage detector 304 is coupled with the write enable input 206. The chip enable high voltage detector 302 and the write enable high voltage detector 304 both contain a high voltage detection circuit (shown in FIG. 4 and discussed in more detail below) which detects when high voltage is placed on their respective input pins 202, 206. The chip enable high voltage detector 302 asserts the output 314 labeled "CEH" when VH is detected on the chip enable input 202. The write enable high voltage detector 304 asserts the output 316 labeled "WEH" when VH is detected on the write enable input 206. VH is preferably a high positive voltage equal to or greater than 8.5 Volts.

The array test signal generator 306 generates the AT 318, ATB 320, VTA 322 and VTAB 324 test mode signals which are used by other circuits discussed below to switch into test mode. The array test signal generator has inputs for the CEH signal 314, the WEH signal 316 and a HWRESET signal 504. The HWRESET signal 504 is generated by the HWRESET circuit (shown in FIG. 5 and discussed in more detail below). When CEH 314, WEH 316 and HWRESET 504 are all logic 1 the NAND gate 326 will be 0. The output of the NAND gate 326 is inverted to generate the AT signal 318 and inverted a second time to generate the ATB signal 320. This results in AT 318=1 and ATB 320=0. These signals indicate that the device 100 is in array test mode. When ATB=0, NAND gate 328 will output a 1 no matter what the value of the other input is. The output of the NAND gate 328 is the VTA signal 322 and the inverted output of the NAND gate 328 is the VTAB signal 324. Therefore VTA 322=1 and VTAB 324=0.

The chip enable override circuit 308 generates the CEFORCE signal 230 to enable the address decoding logic 104, 112, 114, 118, 120 despite the value of the chip enable input 202. When the VTA signal 322 is a logical 1, the NOR gate 330 will output a 0 no matter what the value is on the other input. The output of the NOR gate 330 is connected with an inverter 332 which is connected with the CEFORCE signal 230. This will result in a value of 1 being placed on the CEFORCE signal 230 when the VTA signal 322 is a 1.

Figure 6:
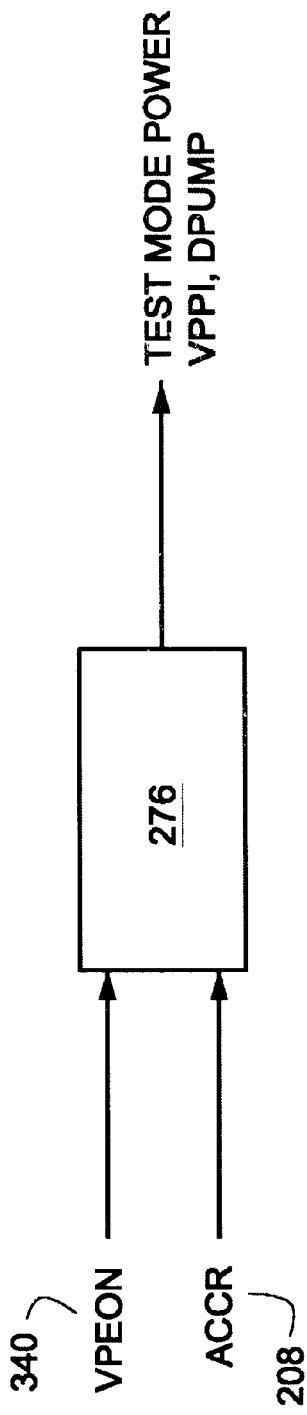
FIG. 6 depicts a schematic diagram of a test mode power circuit for use with the flash memory chip of FIG. 2.

The test power on signal generator 310 is responsive to the VTAB signal 324. The VTAB signal 324 connects to a NAND gate 334. The output of the NAND gate connects to a NOR gate 336. The output of the NOR gate 336 connects to another NOR gate 338. The output of the NOR gate 338 is the test power on signal 340, labeled "VPEON". The VPEON signal goes to the VPPE circuit which is shown in FIG. 6 and described in more detail below. When the VTAB signal is a logic 0, the NAND gate 334 will be forced to output a logic 1 which will in turn force NOR gate 336 to output a 0. NOR gate 338 further has an input for a power on ok signal 342 (labeled "VCCOKB" which is active low). This power-on-ok signal 342 comes from the device 100 power circuits (not shown) which indicates that the device 100 is receiving its normal operating voltage Vcc within the proper tolerances. If the power-on-ok signal 342 and the output of the NOR gate 336 are 0 (indicating test mode and Vcc power is within normal tolerances), then the output of the NOR gate 338, the VPEON signal 340, will be a 1 telling the test power circuits 276 to provide power for testing.

The test mode signal generator 312 generates a test mode signal 344 labeled "TESTM". This signal 344 is used by other read path logic to keep the read path of the device 100 operational in the test mode. The generator 312 has an input for the ATB signal 320. This signal passes through inverter 346 to NOR gate 348. The output of the NOR gate 348 is the test mode signal 344 (labeled "TESTM"). When the ATB signal 320 is 0, the input to the NOR gate 348 is 1 which forces the output of the NOR, the test mode signal 344, to 0.

Figure 4:
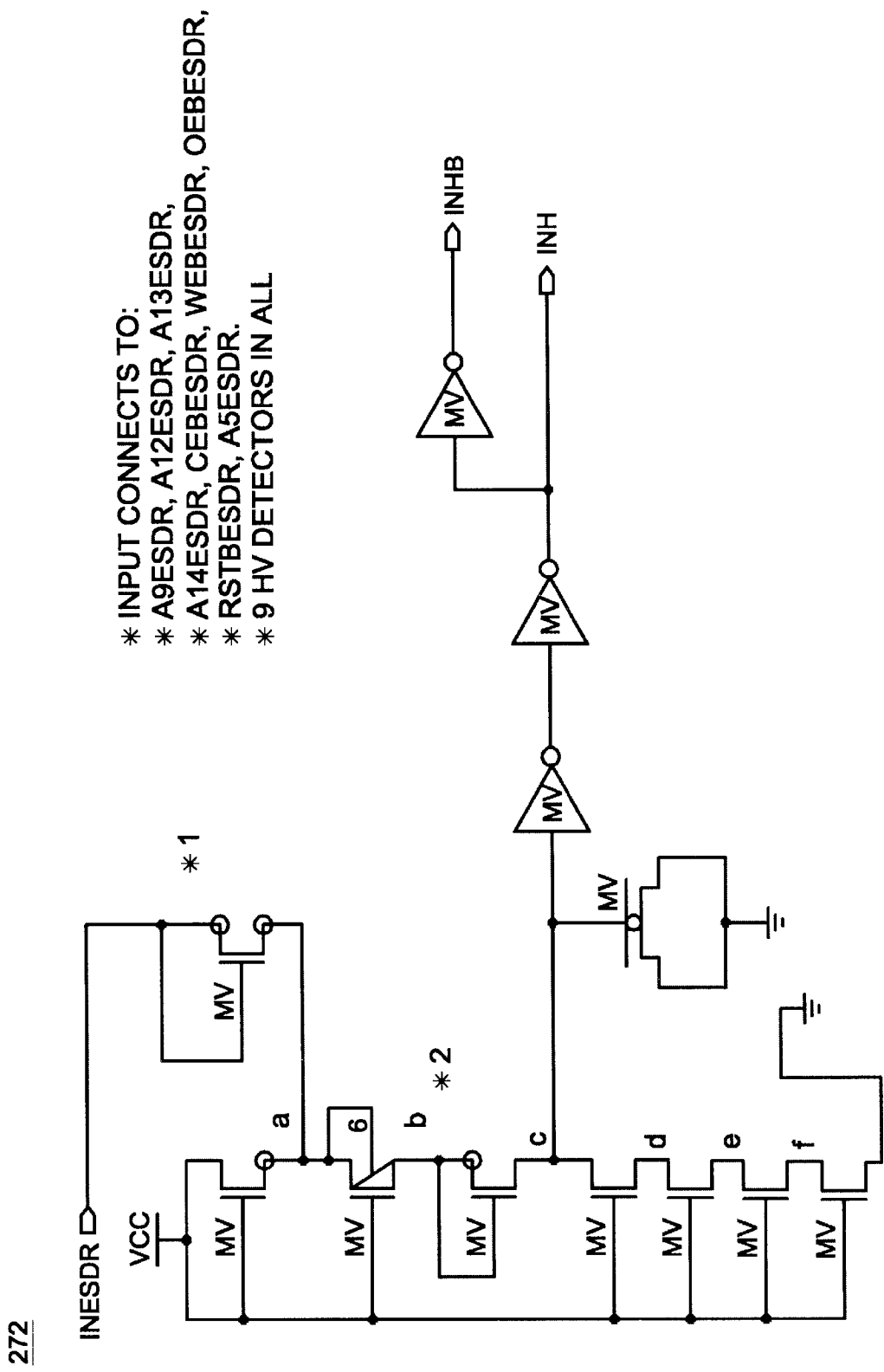
FIG. 4 depicts a schematic diagram of a high voltage detect circuit for use with the flash memory chip of FIG. 2.

Referring to FIG. 4, there is shown a schematic diagram of the high voltage detect circuit 272, labeled "HVD". This logic is a part of the state machine and control logic 122. This schematic shows the implementation of the chip enable high voltage detector 314 and the write enable high voltage detector 316 which have the same circuit design. This circuit is coupled with the respective input pin (chip enable 202 or write enable 206) via the input labeled "INESDR" and detects when VH is placed on the input pin. The circuit 272 will output a 1 via the output labeled "INH" and a 0 via the output "INHB" when high voltage is detected. In the memory device 100, VH is preferably a high positive voltage equal to or greater than 8.5 V.

Figure 5:
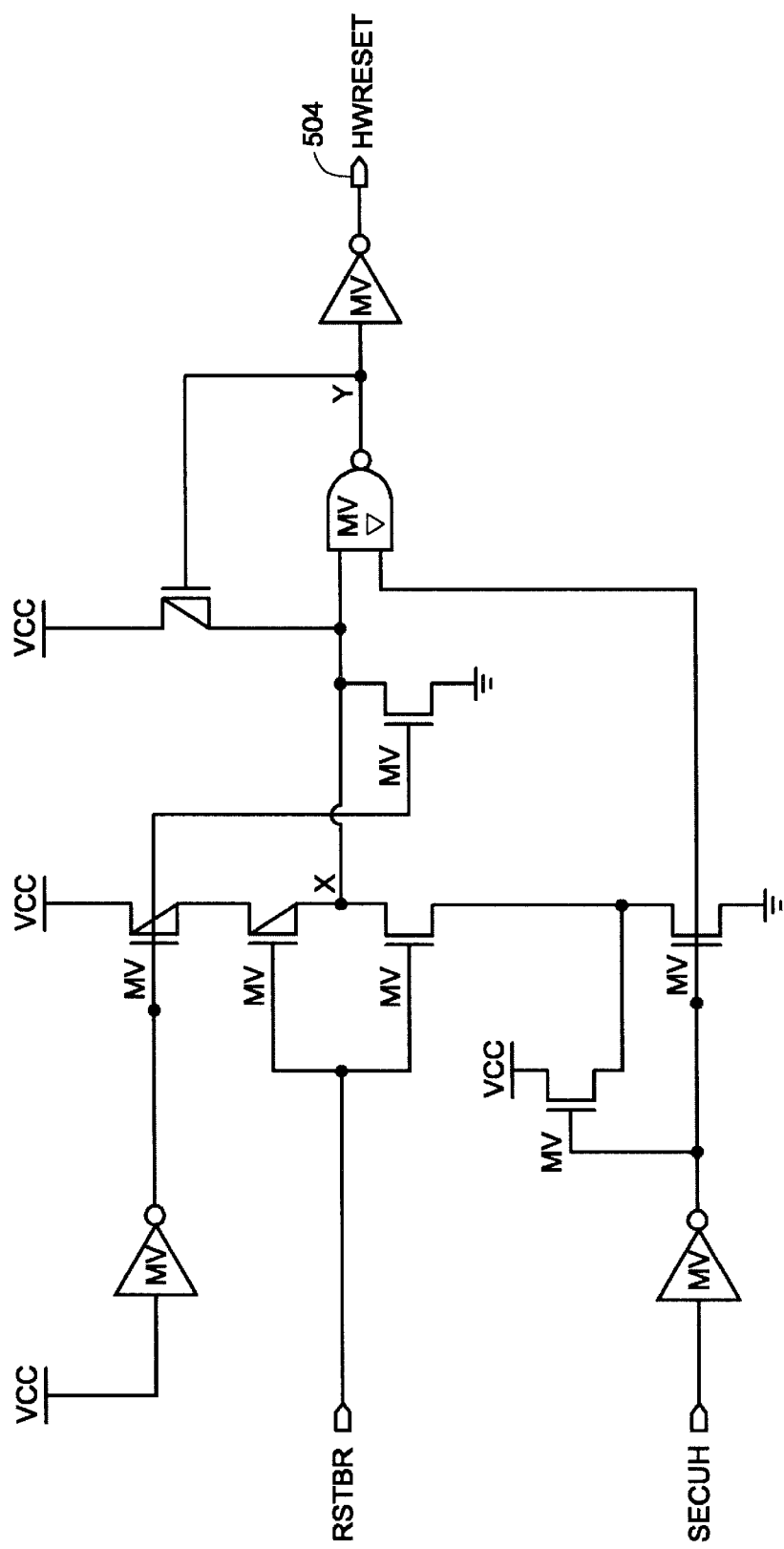
FIG. 5 depicts a schematic diagram of a hardware reset circuit for use with the flash memory chip of FIG. 2.

Referring to FIG. 5, there is shown a schematic diagram of the hardware reset circuit 274, labeled "HWRESET". This logic is a part of the state machine and control logic 122. This circuit 274 generates the hardware reset signal 504 (labeled "HWRESET"). This signal 504 is used by the test logic circuits 270 (described above) to generate the test mode signals. This circuit 504 is coupled with the reset input 210 of the device 100 and outputs a 1 on the HWRBSET signal 504 when the reset input 210 is 0. Note that the reset input 210 is an active low signal.

Referring to FIG. 6, there is shown a schematic diagram of the test mode power circuits 276, labeled "VPPE". This logic is a part of the state machine and control logic 122. This circuit 276 has inputs for the VPEON signal 340 from the test logic circuits 270 and the accelerate pin 208. When the VPEON signal 340 is asserted, this circuit 276 will route the power supplied over the accelerate pin 208 to the internal logic of the device 100. In the memory device 100, Vax=7 Volts is placed on the accelerate pin 208 during Array Vt test mode.

Referring to FIG. 7, there is shown a schematic diagram of the upper bank 194 timing circuits 278, labeled "UTIME". This logic is a part of the state machine and control logic 122. This circuit 278 generates the read timing control signals for the read logic which supports the upper memory bank 194. In normal operation, the UTIME circuits 278 generate specifically timed signals to control and optimize the read access time of the device 100. In Array Vt mode, the UTIME circuits 278 are fixed in a steady state read mode where the normal operation timing is overridden. In this test mode, access time is not an issue. The circuits 278 are responsive to ATB signal 320 and the TESTM signal 344 from the test logic 270. In response to these signals, the UTIME circuits 278 will force on the sense amplifiers 174 to read and output the data from the array. This circuits 278 are cross-coupled with the LTIME circuit 280 which is the circuit that generates the timing signals for the lower memory bank 196. The following signals are inputs to this logic: TESTM 344 (FIG. 3), ATB 320 (FIG. 3), PDAD 1002 (see FIG. 10 which is described in more detail below), ULT 802 (see FIG. 4 which is described in more detail below) and UBRSEL 718. This circuit outputs the following signals: UEQ 704 (see FIG. 19), UKICKB 714 and UPDSA 716. The UBRSEL signal 718 is generated by the address decoding logic 104, 112, 114, 118, 120 which indicates whether or not the upper bank 194 is selected for a read operation based on the input address. The UKICKB signal 714 is used to activate the word line boosters (not shown in the figures) for a normal read operation. In the case of the Array Vt test mode, the word line voltage is supplied externally so the voltage boosters are not used. This signal is an active low signal and is forced to 1 by the UTIME circuits 278. The UPDSA signal 716 is used to power down the upper bank 194 sense amplifiers 174 when the upper bank 194 is not being used.

Referring to FIG. 8, there is shown a schematic diagram of the lower bank 196 timing circuits 280, labeled "LTIME". This logic is a part of the state machine and control logic 122. This circuit 280 generates the read timing control signals for the read logic which supports the lower memory bank 196. In normal operation, the LTIME circuits 280 generate specifically timed signals to control and optimize the read access time of the device 100. In Array Vt mode, the LTIME circuits 280 are fixed in a steady state read mode where the normal operation timing is overridden. In this test mode, access time is not an issue. The circuits 280 are responsive to ATB signal 320 and the TESTM signal 344 from the test logic 270. In response to these signals, the LTIME circuits 280 will force on the sense amplifiers 174 to read and output the data from the array. This circuits 280 are cross-coupled with the LTIME circuit 280 which is the circuit that generates the timing signals for the lower memory bank 196. The following signals are inputs to this logic: TESTM 344 (FIG. 3), ATB 320 (FIG. 3), PDAD 1002 (see FIG. 10 which is described in more detail below), and LBRSEL 820. This circuit outputs the following signals: ULT 802, LLT 806, LEQ 804 (see FIG. 19), LKICKB 714 and LPDSA 716. The LBRSEL signal 718 is generated by the address decoding logic 104, 112, 114, 118, 120 which indicates whether or not the lower bank 196 is selected for a read operation based on the input address. The ULT 802 and the LLT 806 signals go to the final amplifier stage 216A, 216B of the sense amplifiers 174 (See FIGS. 19 and 20 which are described in more detail below). These signals 802, 806 control the latching of output data from the memory banks 194, 196 and are both generated in the LTIME circuits 280 for timing purposes. The LKICKB signal 818 is used to activate the word line boosters (not shown in the figures) for a normal read operation. In the case of the Array Vt test mode, the word line voltage is supplied externally so the voltage boosters are not used. This signal is an active low signal and is forced to 1 by the LTIME circuits 280. The LPDSA signal 816 is used to power down the lower bank 196 sense amplifiers 174 when the lower bank 196 is not being used.

Referring to FIG. 9, there is shown a schematic diagram of the OEFORCE test logic circuits 282, labeled "TEST_LOGIC_2". This circuit is part of the state machine and control logic 122. This circuit has an input for the AT signal 318 from the test logic circuits 270. There is also an input for the HWRESET signal 504 from the HWRESET logic 274 and the CE signal 1004 from the CEBUF circuit 224 (see FIG. 10 which is described in more detail below). The CE signal 1004 will be the inverted value of the chip enable input 202 which in the Array Vt test mode, will be 1 making the CE signal 1004 a 0. This circuit will generate the OEFORCE signal 232 which is used by the WOBUF circuit 228 (see FIG. 11 which is described in more detail below). The OEFORCE signal 232 will override the output enable input 204 and enable the output buffers 180 to output the read data.

Referring to FIG. 10, there is shown a schematic diagram of the chip enable buffer circuits 224, labeled "CEBUF". This circuit 224 generates the CE signal 1004 and the PDAD signal 1002. This circuit is coupled with the chip enable input 202 and the CEFORCE signal 230. The CEFORCE signal 230 will force the PDAD signal 1002 to 0, overriding the value of the chip enable input 202. This signal 1002 controls the address decoders. When PDAD 1002 is a 0, the address decoders turn on. The CE signal 1004 is the inverted value of the chip enable input 202. In Array Vt test mode, the chip enable input 202 is at VH which is a logic 1 state. This sets the CE signal 1004 to 0.

Referring to FIG. 11, there is shown a schematic diagram of the write output buffer circuit 284 of the output buffer control circuit 228, labeled "WOBUF". This circuit 284 is coupled with the output enable input 204, and the OEFORCE signal 232 generated by the TEST_LOGIC_2 circuit 282 (see FIG. 9 described above). The OEFORCE signal 232 overrides the value of the output enable input 204 and forces the OEB output 1102 to 0. The OEB output 1102 goes to the BLHE circuit 286 (see FIG. 12 which is described in more detail below) to generate the output buffer enable signals.

Figure 12:
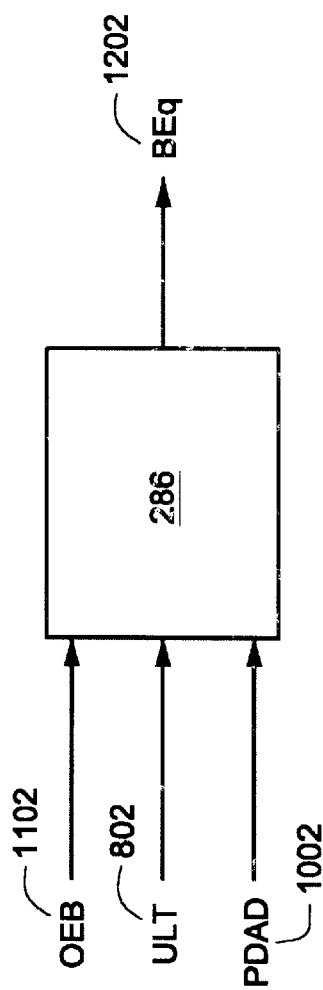
FIG. 12 depicts a schematic diagram of an output buffer control circuit for use with the flash memory chip of FIG. 2.

Referring to FIG. 12, there is shown a schematic diagram of the buffer enable circuits 286 of the output buffer control circuit 228, labeled "BLHE". This circuit 286 generates the buffer enable signals 1202 (labeled "BEq") which enable the output buffers. This circuit is used 16 times for each output buffer 222. This circuit is responsive to the OEB signal 1102 from the WOBUF circuit 284. When the device 100 is operating in byte addressing mode, the BLHE circuit 286 will shut down the unused output buffers 222.

Figure 13:
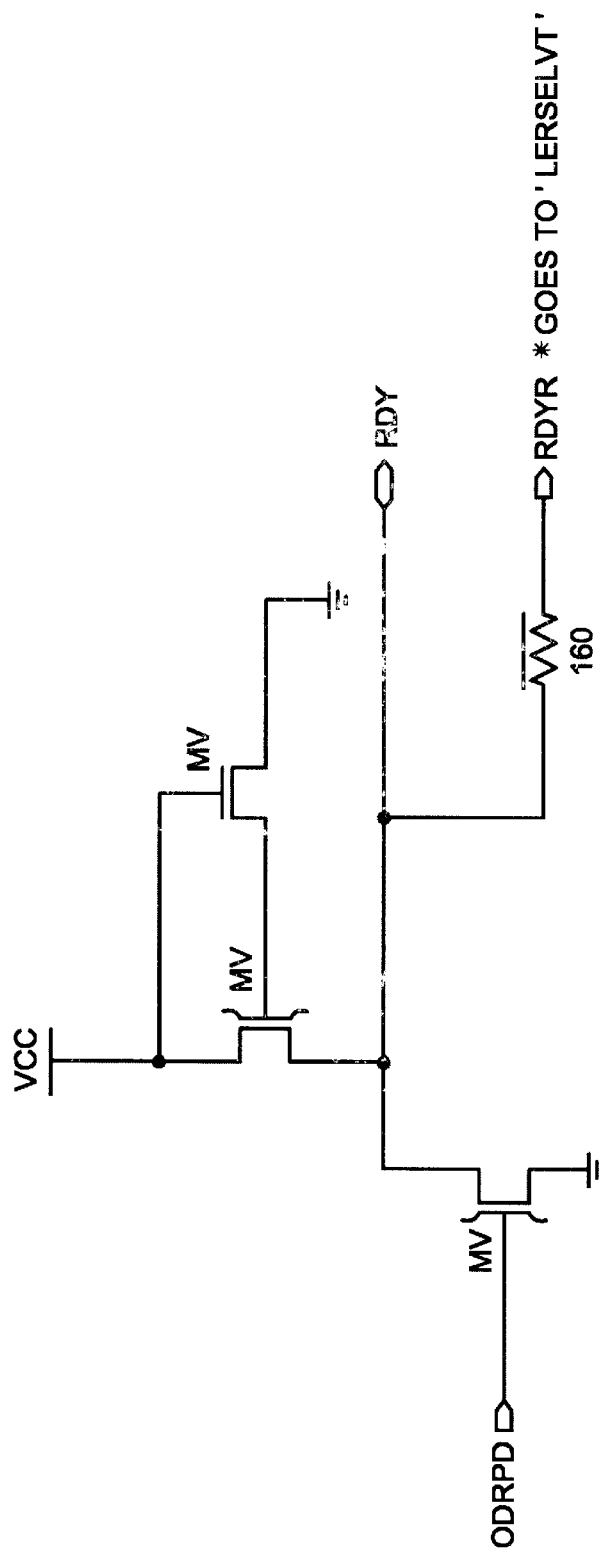
FIG. 13 depicts a schematic diagram of a read/busy input circuit for use with the flash memory chip of FIG. 2.

Referring to FIG. 13, there is shown a schematic diagram of the read/busy input circuit 212, labeled "RBUSYDR". This circuit 212 connects directly with the read/busy input pin of the device 100. During normal operation, this pin is an output which shows the status of the device 100 to the user. However, during the Array Vt test mode, this pin is used as an input for the test voltage. This circuit 212 implements the bi-directional nature of the read/busy pin. The output 1302 (labeled "RDYR") of the circuit goes to the lower erase select Vt circuit (see FIG. 14 which is described in more detail below) where it is routed ultimately to the word lines of the memory banks 194, 196.

Figure 14:
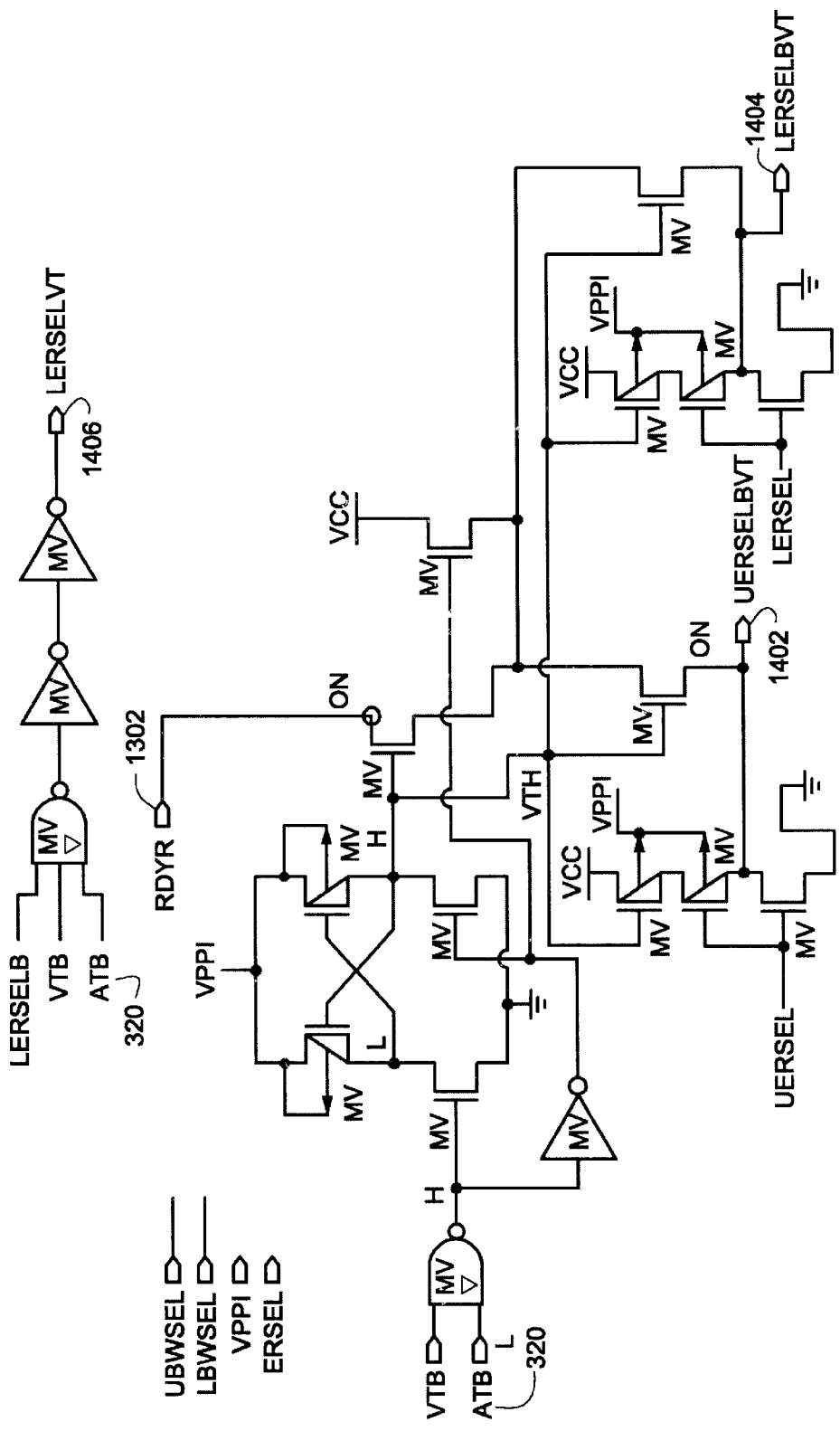
FIG. 14 depicts a schematic diagram of a lower erase select Vt circuit for use with the flash memory chip of FIG. 2.

Referring to FIG. 14, there is shown a schematic diagram of the lower erase select Vt circuits 288 of the word line control circuit 234, labeled "LERSELVT". This circuit 234 has inputs for the ATB signal 320 from the test logic circuits 270 (see FIG. 3) and the RDYR signal 1302 from the read/busy input 212 (see FIG. 13). If the ATB signal 320 is 0 (which it will be when the device 100 is in array VT mode), the circuit 234 routes the RDYR signal 1302 (which is carrying the input test voltage from the read/busy input pin) to the word line power selection circuits 292 (see FIG. 16) via the output signals 1402, 1404 (labeled "UERSELBVT" and "LERSELBVT" respectively). This circuit 288 also generates the output signal 1406 (labeled "LERSELVT") which tells the word line power selection circuits 292 for the lower bank 196 to select the LERSELBVT input 1404 as the power source for the array word lines as opposed to the normal read power supply.

Figure 15:
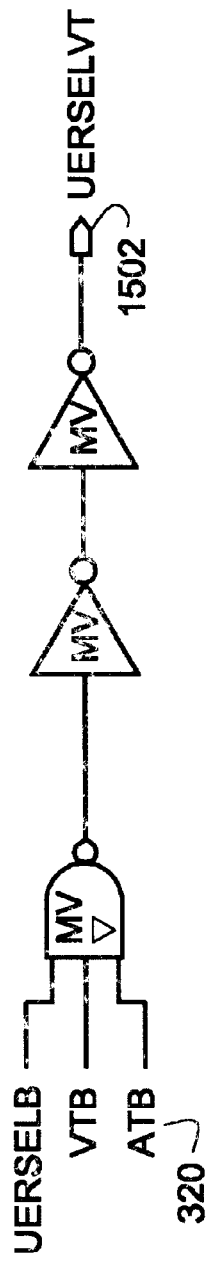
FIG. 15 depicts a schematic diagram of upper erase select Vt circuit for use with the flash memory chip of FIG. 2.

Referring to FIG. 15, there is shown a schematic diagram of the upper erase select Vt circuits 290 of the word line control circuit 234, labeled "UERSELVT". This circuit 290 has an input for the ATB signal 320 from the test logic circuits 270 (see FIG. 3). This circuit 290 generates the output signal 1502 (labeled "UERSELVT") which tells the word line power selection circuits 292 for the upper bank 194 to select the UERSELBVT input 1402 as the power source for the array word lines as opposed to the normal read power supply.

Figure 16:
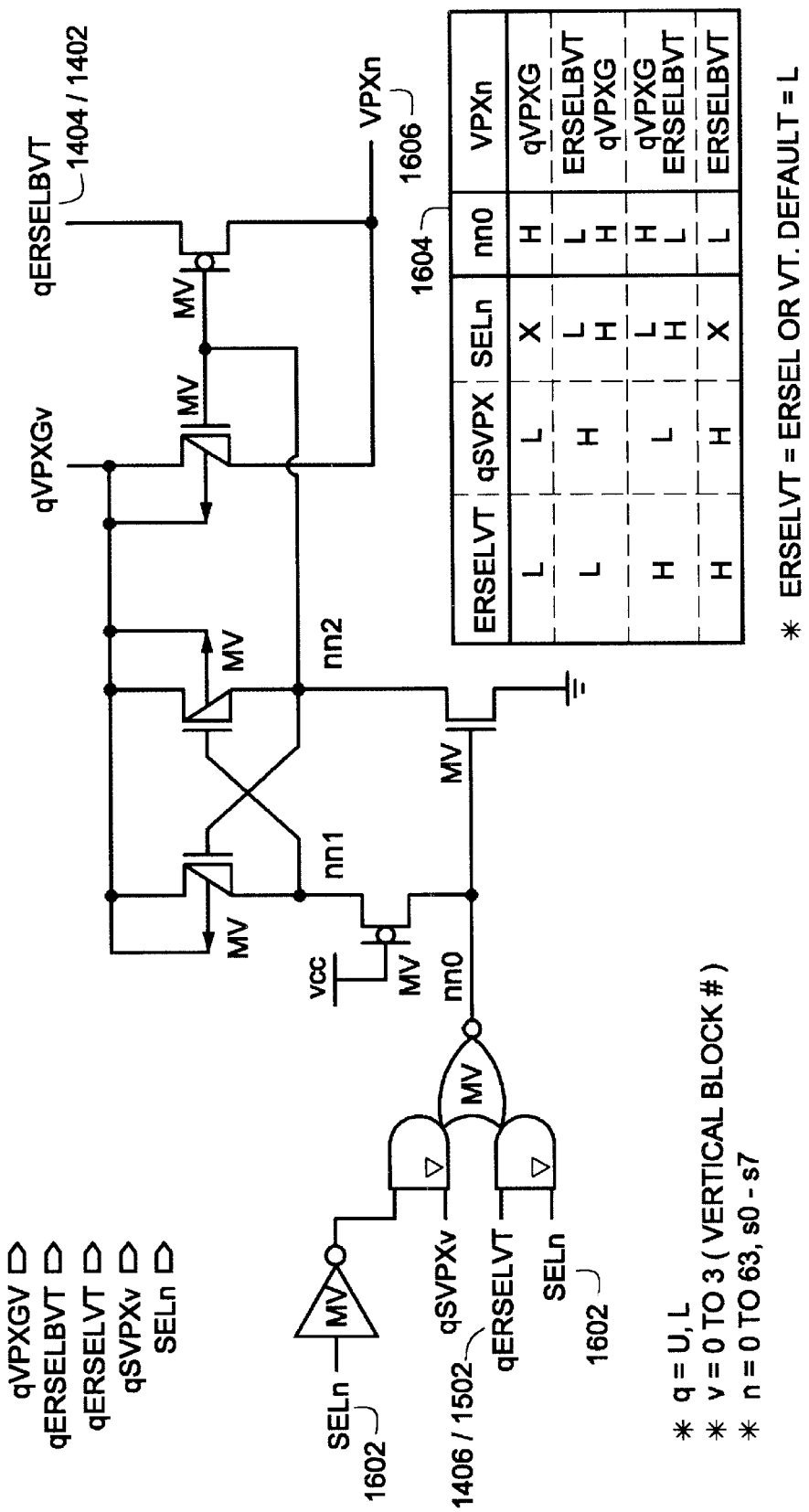
FIG. 16 depicts a schematic diagram of a power selection circuit for use with the flash memory chip of FIG. 2.

Referring to FIG. 16, there is shown a schematic diagram of the word line power selection circuits 292 of the word line control circuit 234, labeled "VPX". This circuit 292 is used for each sector in the memory array. In the memory device 100, the memory array is broken down into 65 sectors. 63 of the sectors are normal 64 Kilobit sectors. One of the sectors is actually eight 8 kilobit sectors. The last sectors is secured sector which is a special protected sector. The division of sectors between the upper and lower banks 194, 196 is variable and depends on the sliding bank architecture as described above. The signal names in the VPX circuit 292 which are bank dependent are preceded by a "q", where q=U or L depending on the bank 194, 196 in which the sector corresponding to this VPX circuit 292 is located. The circuit 292 has inputs for the qERSELBVT signal 1402, 1404, the qERSELVT signals 1406, 1502 and a selection signal 1602 (labeled "SELn"). Operation of this circuit 292 is detailed in the truth table 1604 which details which combination of inputs will route which power supply to the word lines in the particular sector. In Array Vt test mode, the qERSELBVT input 1402, 1404 is routed to the word lines, effectively routing the read/busy pin input test voltage to the memory array transistors via the output signal 1606 (labeled "VPXn").

Figure 17:
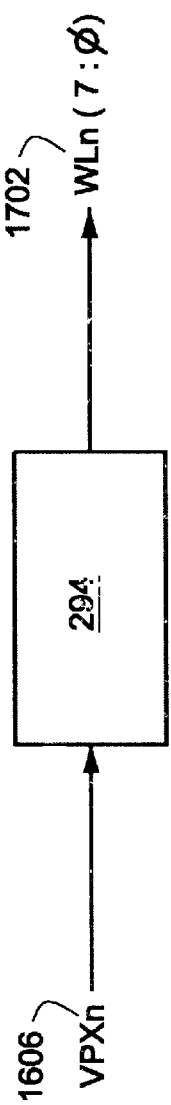
FIG. 17 depicts a schematic diagram of a word line driver circuit for use with the flash memory chip of FIG. 2.

Referring to FIG. 17, there is shown a schematic diagram of the word line drivers 294 of the word line control circuit 234, labeled "XDECEND". This circuit 294 is depicted for 8 word lines. Each word line is for 1 sector, therefore this circuit is used 8 times for 64 sectors plus it is implemented once for a single word line for the 65$^{th}$ sector. This circuit 294 connects to the word lines of memory array and to the address decoding logic 104, 112, 114, 118, 120. This circuit 294 selects the proper row in the array and provides the voltage supplied by the VPX circuits 292 to the gates of the memory cell transistors within the row. This circuit 294 has an input for the VPXn output signal 1606 of the VPX circuit 292 and an output 1702 for the word line (labeled "WLn").

Figure 18:
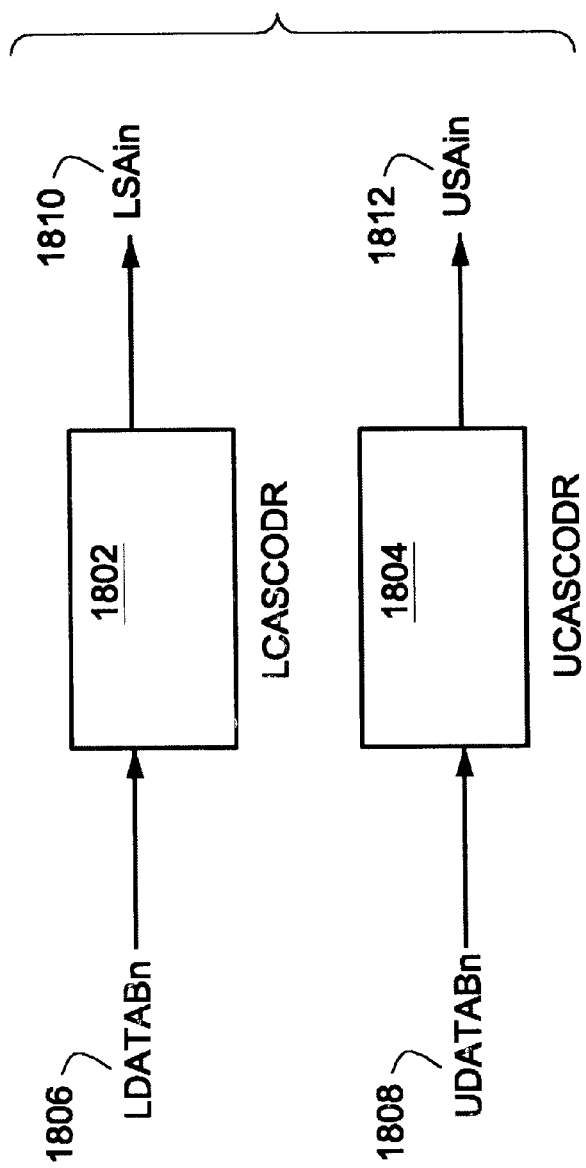
FIG. 18 depicts a schematic diagram of an upper and lower bank sense pre-amplifier circuits for use with the flash memory chip of FIG. 2.

Referring to FIG. 18, there is shown a schematic diagram of the upper and lower bank sense pre-amplifier 214 circuits, labeled "LCASCODR" 1802 and "UCASCODR" 1804. These circuits 214 pre-amplify the data from the memory array. The data from the lower memory bank 196 comes into the LCASCODR 1802 via the input 1806 (labeled LDATABn) and the data from the upper memory bank 194 comes in to the UCASCODR 1804 via the input 1808 (labeled UDATABn). The data is then amplified and passed on to the upper and lower final amplifier stages 216A, 216B (see FIGS. 19 and 20) via the outputs 1810, 1812 (labeled "LSAin" and "USAin" respectively). These outputs form the qSAin signal path 260 from the pre-amplifiers 214 to the final amplifier stages 216A, 216B. Each of these circuits 1802, 1804 are used 16 times for a total of 32 instances, once for each bit that can be read out of the memory array at any given time from each bank 194, 196.

Figure 19:
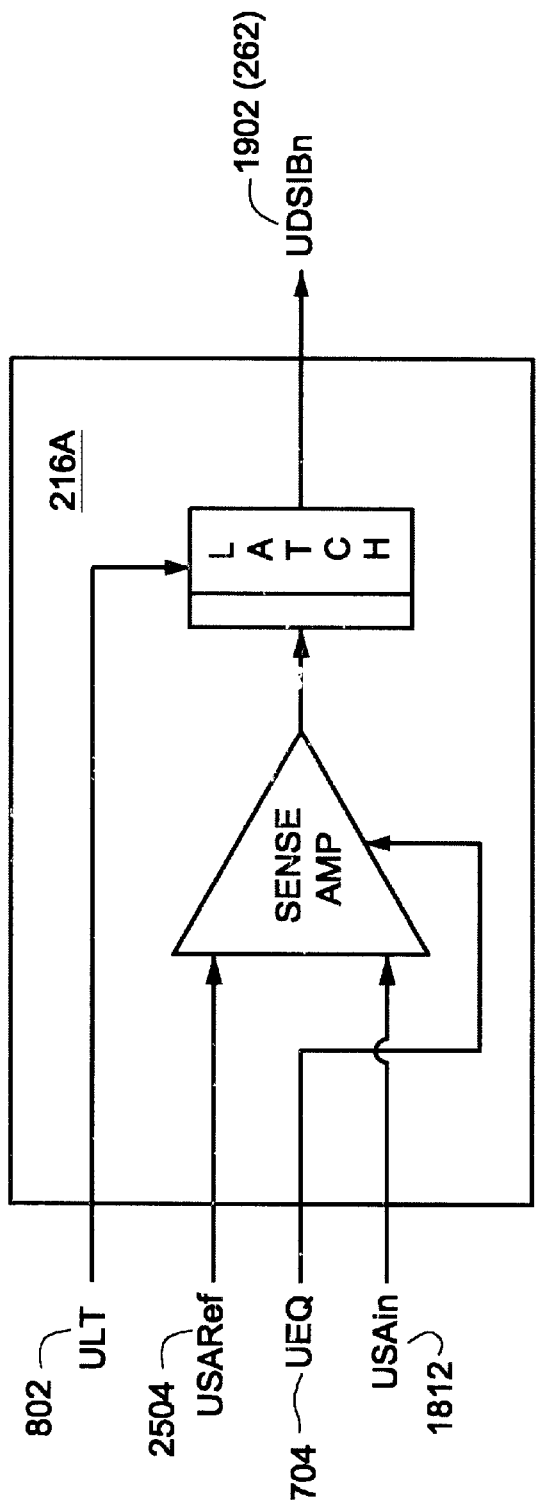
FIG. 19 depicts a schematic diagram of an upper bank final stage amplifier for use with the flash memory chip of FIG. 2.

Referring to FIG. 19, there is shown a schematic diagram of the upper bank final amplifier stage 216A circuit, labeled "USAMP". The USAMP 216A receives the USAin signal 1812 from the UCASCODR 1804, the ULT signal 802 from the LTIME circuit 280 (see FIG. 8) and the UEQ signal 704 from the UTIME circuit 278 (see FIG. 7). The ULT signal 802 and the UEQ signal 704 enable the USAMP 216A to operate. The USAMP 216A is a differential amplifier which compares the input signal, USAin 1812 with a reference signal 2504 from the reference circuits (see FIGS. 25–29). The USAMP 216A outputs the data from the output 1902 (labeled "UDSIBn"). This output 1902 along with the output 2002 from the LSAMP 216B (see FIG. 20) forms the qDSIBn signal path 262 to the I/O multiplexers 182. This circuit 216A is designed to gate the LDSIBn output 1902 so that it is only active when the lower bank 196 is being read otherwise a 0 is output.

Figure 20:
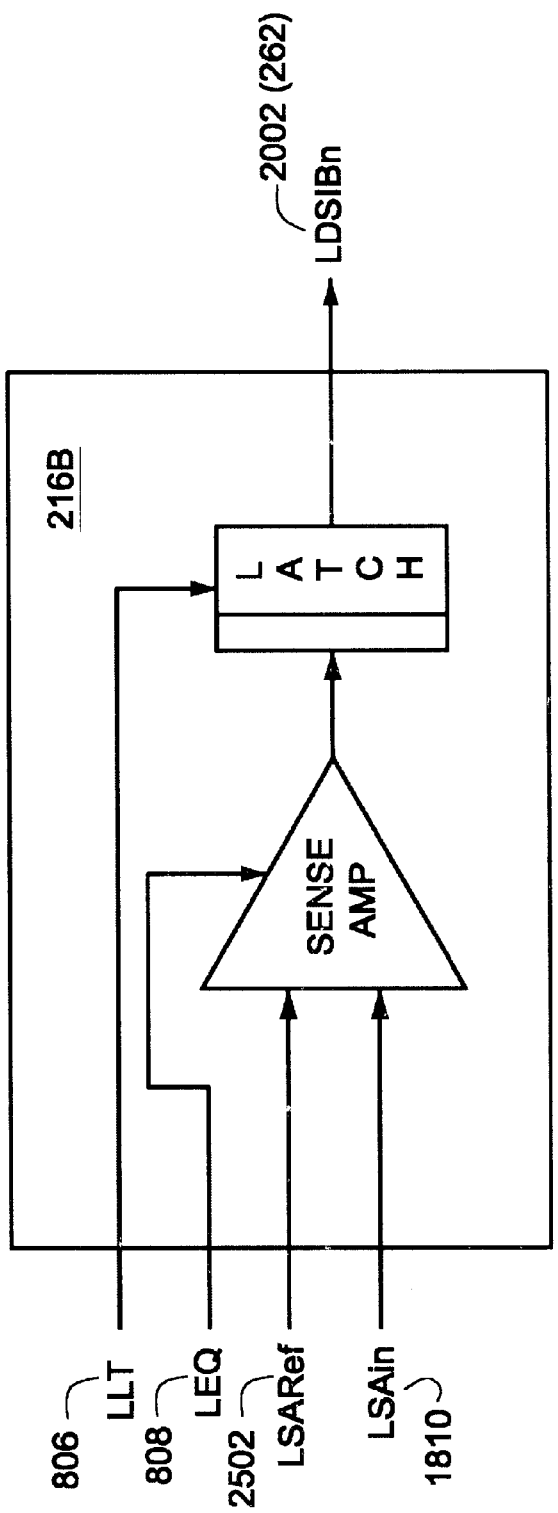
FIG. 20 depicts a schematic diagram of a lower bank final stage amplifier for use with the flash memory chip of FIG. 2.

Referring to FIG. 20, there is shown a schematic diagram of the lower bank final stage amplifier 216B circuits, labeled "LSAMP". The LSAMP 216B receives the LSAin signal 1812 from the LCASCODR 1802, the LLT signal 806 from the LTIME circuit 280 (see FIG. 8) and the LEQ signal 808 from the LTIME circuit 280 (see FIG. 8). The LLT signal 806 and the LEQ signal 808 enable the LSAMP 216B to operate. The LSAMP 216B is a differential amplifier which compares the input signal, LSAin 1810 with a reference signal 2502 from the reference circuits (see FIGS. 25–29). The LSAMP 216B outputs the data from the output 2002 (labeled "LDSIBn"). This output 2002 along with the output 1902 from the USAMP 216A (see FIG. 19) forms the qDSIBn signal path 262 to the I/O multiplexers 182. This circuit 216B is designed to gate the UDSIBn output 2002 so that it is only active when the upper bank 194 is being read otherwise a 0 is output.

Figure 21:
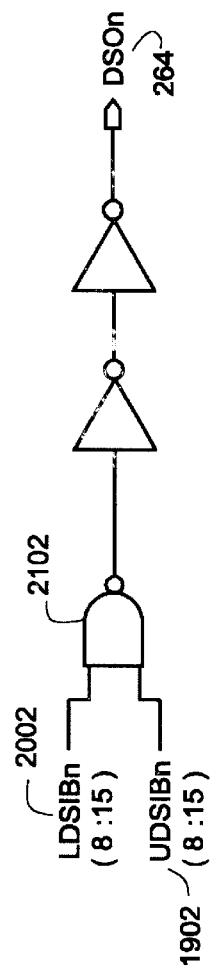
FIG. 21 depicts a schematic diagram of a high byte output multiplexer for use with the flash memory chip of FIG. 2.

Referring to FIG. 21, there is shown a schematic diagram of the high byte output multiplexer 218 circuits, labeled "IOXH". This circuit 218 is used 8 times for each bit of the high byte of the word that can be output from device 100. The multiplexer 218 has inputs for the high byte (bits 8:15) LDSIBn 1902 and UDSIBn 2002 signals from the LSAMP 216A and the USAMP 216B respectively. The multiplexing is accomplished with a NAND gate 2102 which effectively passes the active signal through to the output 264 (labeled "DSOn").

Figure 22:
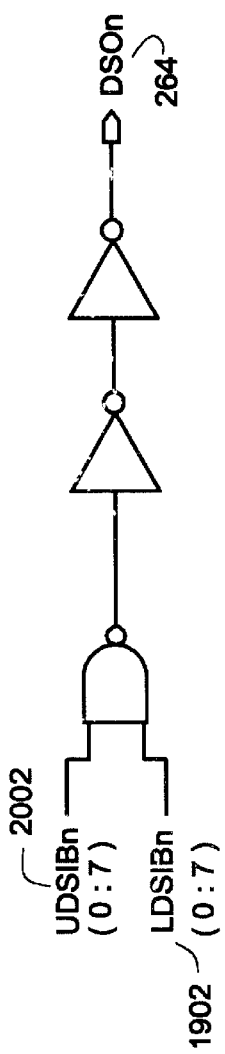
FIG. 22 depicts a schematic diagram of a low byte output multiplexer for use with the flash memory chip of FIG. 2.

Referring to FIG. 22, there is shown a schematic diagram of the low byte output multiplexer 220 circuits, labeled "IOXL". This circuit 220 is used 8 times for each bit of the low byte of the word that can be output from device 100. The multiplexer 220 has inputs for the low byte (bits 0:7) LDSIBn 1902 and UDSIBn 2002 signals from the LSAMP 216A and the USAMP 216B respectively. The multiplexing is accomplished with a NAND gate 2102 which effectively passes the active signal through to the output 264 (labeled "DSOn").

Figure 23:
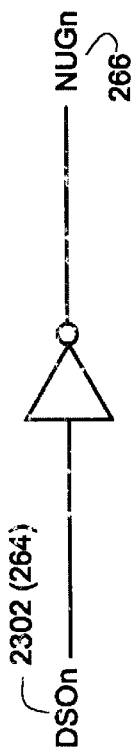
FIG. 23 depicts a schematic diagram of an output buffer circuit for use with the flash memory chip of FIG. 2.

Referring to FIG. 23, there is shown a schematic diagram of the output buffer 222 circuits, labeled "OBUF". This circuit 222 has an input 2302 for the DSOn signals 264 from the I/O multiplexers (see FIGS. 21 and 22). The data is buffered and then sent to the output buffer drivers 226 via the output 266 (labeled "NUGm").

Figure 24:
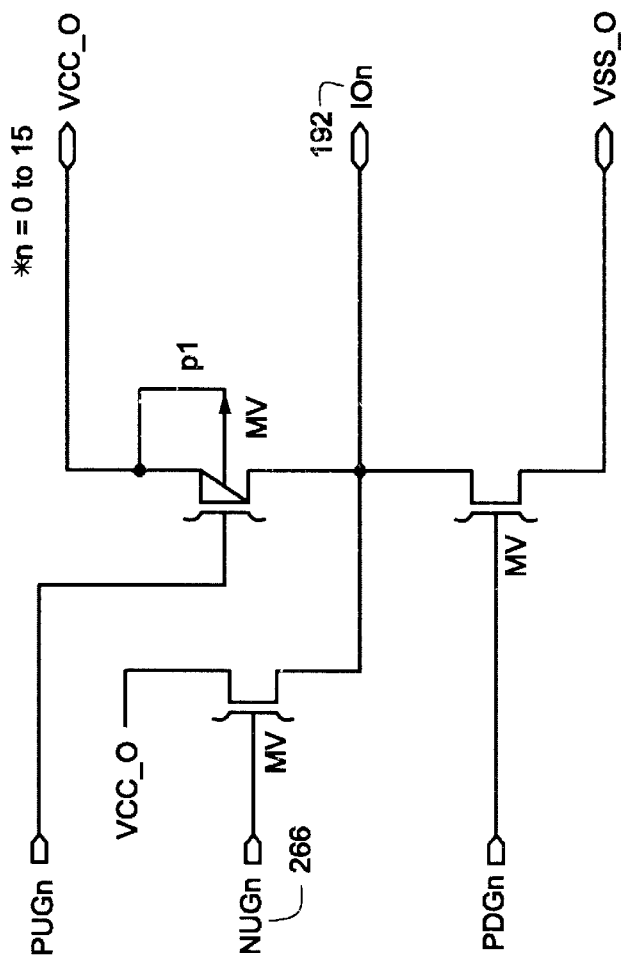
FIG. 24 depicts a schematic diagram of an output buffer driver circuit for use with the flash memory chip of FIG. 2.

Referring to FIG. 24, there is shown a schematic diagram of the output buffer driver 226 circuits, labeled "OBUFDR". The output buffer driver 226 receives the data to be output from the output buffer 222 via the NUGm signal paths 266. The output buffer driver 226 couples the output buffer 222 to the output pins 192 and also implements the bi-directional capability of the output pins 192.

Figure 25:
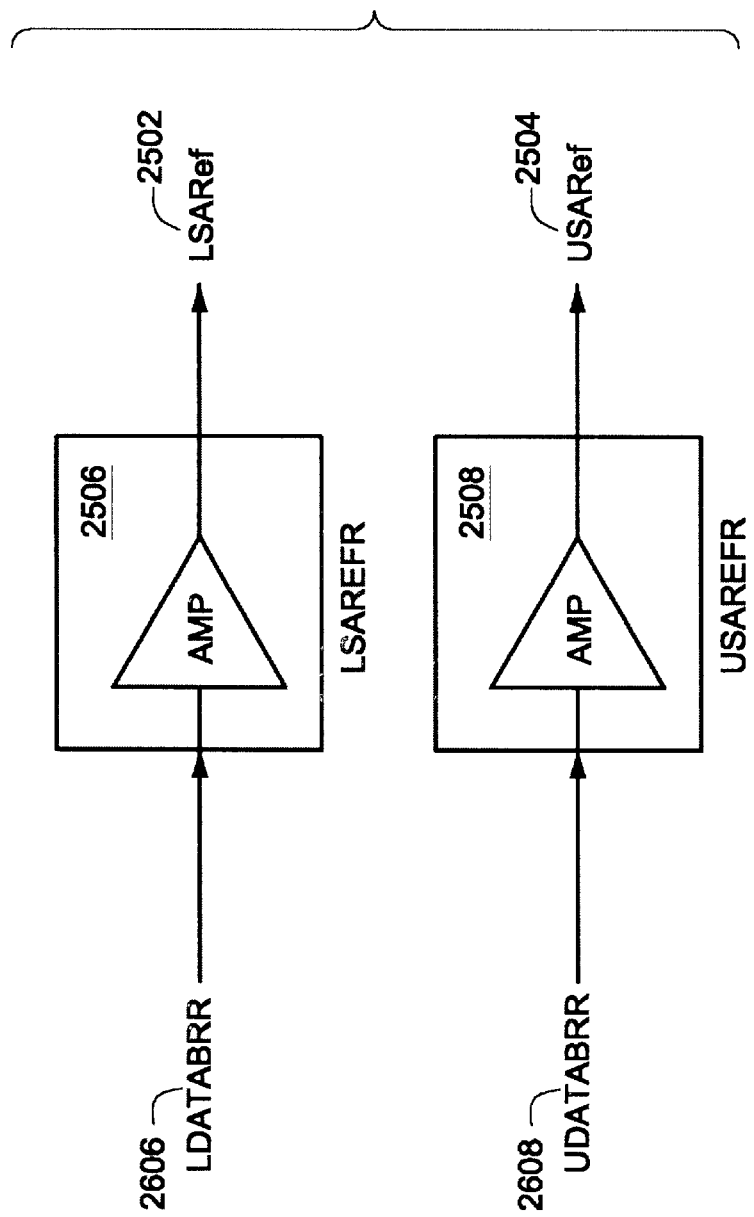
FIG. 25 depicts a schematic diagram of lower and upper bank reference sense pre-amplifier circuits for use with the flash memory chip of FIG. 2.

Referring to FIG. 25, there is shown a schematic diagram of the lower and upper bank reference sense pre-amplifier circuits 238. The reference sense preamplifier circuits 238 include a lower bank reference sense pre-amplifier 2506 (labeled "LSAREFR") and an upper bank reference sense pre-amplifier 2508 (labeled "USAREFR"). These pre-amplifier circuits are coupled with the reference transistor cells 244, 246 in the reference array 242 by the reference signal paths 240. They pre-amplify the reference values and send them to the final amplifier stage 216A, 216B where they are used to sense the data from the memory array. The LSAREFR circuit 2506 is coupled with the LSAMP 216B via the LSAref signal path 2502. The USAREFR circuit 2508 is coupled with the USAMP 216A via the USAref signal path 2504. They are coupled with the reference signal paths 240 via the LDATABRR 2606 and UDATABRR 2608 signal paths which together form the qDATABRR signal path 268 between the reference signal paths 240 and the reference sense pre-amplifiers 238.

Figure 26:
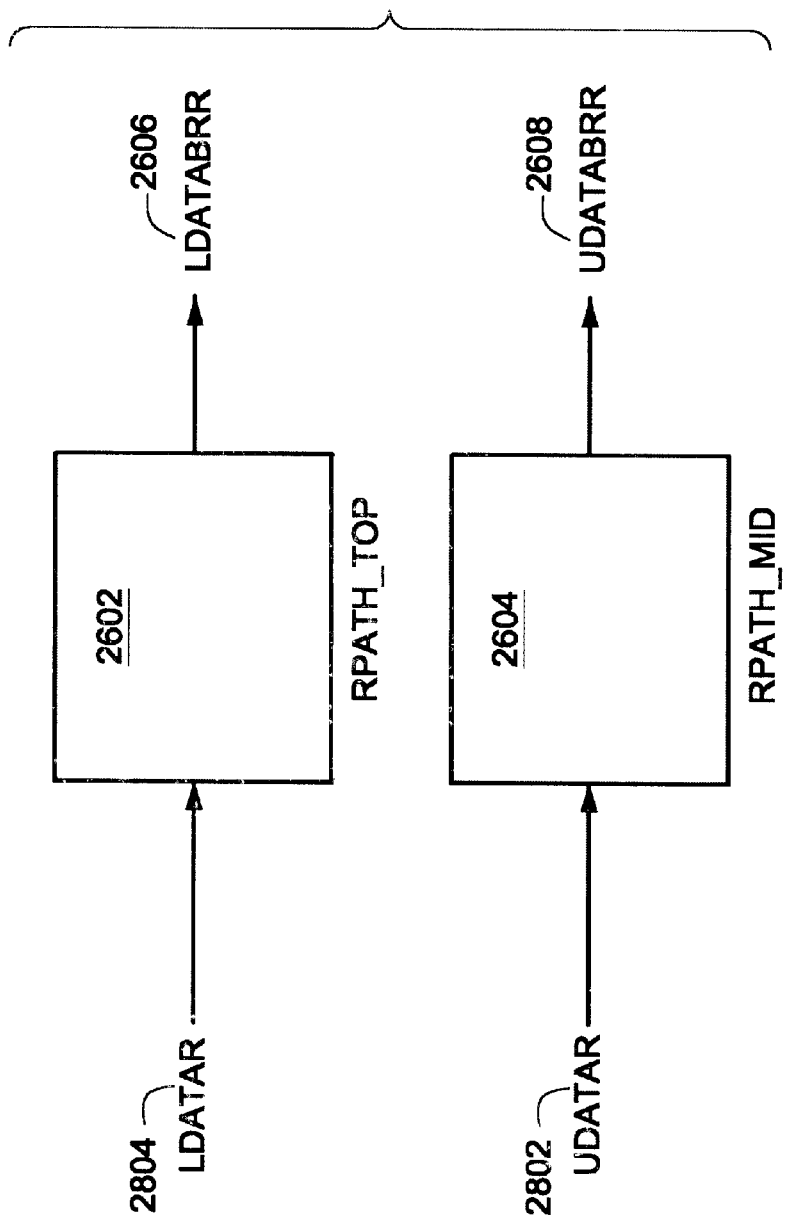
FIG. 26 depicts a schematic diagram of a reference signal path for use with the flash memory chip of FIG. 2.

Referring to FIG. 26, there is shown a schematic diagram of the reference signal path circuits 240, labeled "RPATH_TOP" and "RPATH_MID". These circuits 240 interconnect the reference array 242 with the reference sense amplifiers 238. The nature of the signals passing through these circuits 240 necessitates that they provide high isolation and noise control. The reference signal path circuits 240 include an upper circuit 2602 for interconnecting the reference array 242 with the upper bank 194 reference sense amplifier 2508 and a lower circuit 2604 for interconnecting the reference array 242 with the lower bank 196 reference sense amplifier 2506. The inputs to the circuits 240 are UDATAR 2802 and LDATAR 2804 which come from the reference array multiplexer 248 and together form the qDATAR signal path 270. The outputs of the reference signal path circuits are LDATABRR 2606 and UDATABRR 2608 which together form the signal path qDATABRR 268.

Figure 27:
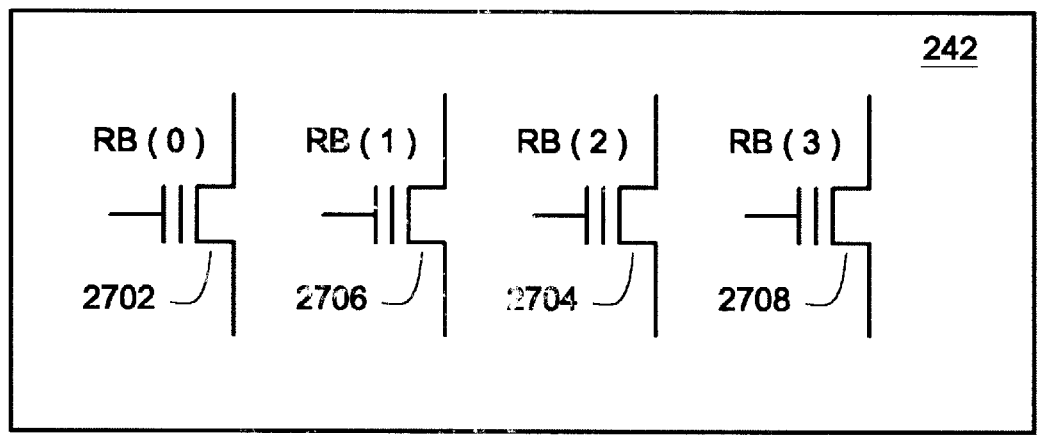
FIG. 27 depicts a schematic diagram of a reference array for use with the flash memory chip of FIG. 2.

Referring to FIG. 27, there is shown a schematic diagram of the reference array 242 circuits, labeled "ARRAY". The reference array 242 contains four reference transistors, a erase reference cell 2702 (labeled "RB(0)"), a read reference cell 2704 (labeled "RB(2)"), a program reference cell 2706 (labeled "RB(3)") and an auto-program-disturb-after-erase-verify reference cell 2708 (labeled "RB(4)"). Each reference cell is used for different functions of the device 100. When the device 100 is in Array Vt test mode, the erase reference cell is used. The reference cells are in a large array of dummy cells which are used to isolate the reference cells from the remainder of the logic of the device 100.

Referring to FIG. 28, there is shown a schematic diagram of the reference array multiplexer 248 circuits, labeled "REFPBL". This circuit 28 determines which reference cell 2702, 2704, 2706, 2708 is used at any given time. This circuit 248 has an input for the ATB signal 320 from the test logic circuits 270 (see FIG. 3). When the ATB signal is a 0, NAND gate 2806 will turn on and subsequently turn on transistors 2808 and 2810 which connect the erase reference cell RB(0) to the UDATAR 2802 and LDATAR 2804 outputs which together form the qDATAR signal path 270 to the reference signal path circuits 240.

As can be seen, the implementation of the disclosed embodiments shares much of the same logic as the normal read operating mode of the memory device 100. This saves design time and cost because separate circuitry specifically for the Array Vt test mode does not have to be implemented.

It is to be noted that suitable transistor sizes specifying channel width to length ratios (measured in micrometers or microns) for the transistors which make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment.

It is therefore intended that the foregoing detailed description be regarded as illustrative rather than limiting, and that it be understood that it is the following claims, including all equivalents, that are intended to define the spirit and scope of this invention.

We claim:

1. A method for determining the transistor threshold voltage distribution in a flash memory array of a flash memory chip, said memory array comprising a first memory bank and a second memory bank, the method comprising:
    (a) selecting a first memory cell within said first memory bank, said first memory cell comprising a gate input;
    (b) placing a voltage on said gate input;
    (c) determining whether said first memory cell changes state after (b) while simultaneously placing a voltage on a second memory cell in said second memory bank; and
    (d) changing said voltage on said first memory cell based on (c).

2. The method of claim 1, wherein (c) further comprises: Comparing said state of said first memory cell to a reference memory cell.

3. The method of claim 1, wherein (c) further comprises: reading an output voltage of said first memory cell; comparing said output voltage to a known voltage.

4. The method of claim 1, wherein said voltage is initially low and further wherein (d) further comprises: increasing said voltage.

5. The method of claim 4, wherein said voltage is increased by a fixed amount.

6. The method of claim 4, wherein said voltage is increased by 0.1 Volts.

7. The method of claim 4, wherein said voltage is initially 0 Volts.

8. The method of claim 4, wherein said voltage is initially a negative voltage.

9. The method of claim 1, wherein (c) further comprises:
determining whether said memory cell changes state between an on state and an off state.

10. The method of claim 1, wherein (b) further comprises:
placing said voltage on an input pin of said flash memory chip; and
routing said voltage from said input pin to said gate input.

11. The method of claim 1, further comprising:
(e) generating said voltage externally to said flash memory chip.

12. The method of claim 1, further comprising:
(e) generating said voltage internally to said flash memory chip.

13. An apparatus for determining a transistor array voltage threshold distribution, said apparatus comprising:
a flash memory array comprising a first memory bank and a second memory bank, said first memory bank comprising a first flash memory transistor, said flash memory transistor comprising a gate input and a drain output;
a variable voltage source operative to produce a voltage at said gate input;
an address decoder coupled with said flash memory array for selecting said first flash memory transistor;
a voltage inducer coupled with said flash memory array, said variable voltage source and said address decoder and operative to induce said voltage on said gate input of said selected first flash memory transistor;
a comparator coupled with said drain output and operative to determine a state of said first flash memory transistor;
a first multiplexer coupled to said first memory bank and to said second memory bank; and, a second multiplexer coupled to said first memory bank and to said second memory bank.

14. The apparatus of claim 13, wherein said variable voltage source is further coupled with said comparator and further operative to vary said voltage until said first flash memory transistor changes state.

15. The apparatus of claim 14, wherein said state comprises whether said first flash memory transistor is on.

16. The apparatus of claim 13, wherein said variable voltage source is located on an integrated circuit upon which said flash memory array is located.

17. The apparatus of claim 13, wherein said comparator further comprises a reference flash memory transistor.

18. The apparatus of claim 13, wherein said state comprises whether said first flash memory transistor is on.

19. The apparatus of claim 18, wherein said variable voltage source is further coupled with said comparator and further operative to vary said voltage until said first flash memory transistor turns on.

20. The apparatus of claim 19, wherein said variable voltage source is further operative to increase said voltage.

21. The apparatus of claim 19, wherein said variable voltage source is further operative to decrease said voltage.

22. The apparatus of claim 19, wherein said memory array further comprises a second flash memory transistor and wherein said apparatus further comprising an address generator coupled with said address decoder and said comparator and operative to generate a first address corresponding to said first flash memory transistor and further operative to generate a second address corresponding to said second flash memory transistor when said first flash memory transistor turns on.

23. The apparatus of claim 13, wherein said state comprises whether said first flash memory transistor is off.

24. The apparatus of claim 23, wherein said variable voltage source is further coupled with said comparator and further operative to vary said voltage until said first flash memory transistor turns off.

25. The apparatus of claim 24, wherein said variable voltage source is further operative to increase said voltage.

26. The apparatus of claim 24, wherein said variable voltage source is further operative to decrease said voltage.

27. The apparatus of claim 24, wherein said memory array further comprises a second flash memory transistor and wherein said apparatus further comprising an address generator coupled with said address decoder and said comparator and operative to generate a first address corresponding to said first flash memory transistor and further operative to generate a second address corresponding to said second flash memory transistor when said first flash memory transistor turns off.

28. An apparatus for determining the transistor turn on threshold voltage distribution for a flash memory device, said apparatus comprising:
a first memory bank comprising a memory cell transistor, said memory cell transistor comprising a gate input and defined by a threshold voltage ($V_t$) and operative to store a data value;
a second memory bank;
a first multiplexer coupled to said first memory bank and to said second memory bank; and,
a second multiplexer coupled to said first memory bank and to said second memory bank.
a test voltage source for providing a test voltage to said gate input of said memory cell transistor;
a read voltage source for providing a read voltage to said gate input of said memory cell transistor;
a selector coupled with said test voltage source and said read voltage source for selecting between said test voltage source and said read voltage source and having an output for a selected voltage;
an address decoder coupled with said memory bank and said selector and operative to select said memory cell transistor and provide said selected voltage to said gate input;
a read circuit operative to read the output of said selected memory cell transistor and whether said selected voltage is greater than said $V_t$ and further operative to output a logical 1 if said selected voltage is greater than said $V_t$ and a logical zero if said selected voltage is less than said $V_t$; and
wherein said flash memory device operates in a test mode where said selector selects said test voltage source and a normal mode where said selector selects said read voltage source.

29. The apparatus of claim 28 further comprising
a tester coupled with said test voltage source and said output of said read circuit and operative to increase said test voltage from a zero value until said test voltage exceeds said Vt.

30. A method for determining the transistor threshold voltage distribution in a flash memory array of a flash memory chip, said memory array comprising a first memory bank and a second memory bank, the method comprising:
(a) selecting a first memory cell within said first memory bank, said first memory cell comprising a gate input;
(b) placing a voltage on said gate input; and
(c) determining whether said first memory cell changes state after (b) while simultaneously programming a memory cell in said second memory bank.

* * * * *